United States Patent
Polla et al.

[11] Patent Number: 5,914,507
[45] Date of Patent: Jun. 22, 1999

[54] PZT MICRODEVICE

[75] Inventors: Dennis L. Polla, Brooklyn Park, Minn.; Joon Han Kim, Seoul, Rep. of Korea

[73] Assignee: Regents of the University of Minnesota, Minneapolis, Minn.

[21] Appl. No.: 08/739,808

[22] Filed: Oct. 30, 1996

Related U.S. Application Data

[63] Continuation-in-part of application No. 08/680,920, Jul. 15, 1996, abandoned, which is a continuation-in-part of application No. 08/241,052, May 11, 1994, Pat. No. 5,536,963.

[51] Int. Cl.$^6$ .................................................. H01L 29/82
[52] U.S. Cl. .......................... 257/254; 257/417; 257/418; 257/420; 257/753; 73/514.21; 73/514.22; 73/514.23; 73/514.34; 73/514.36; 73/DIG. 1; 73/DIG. 4
[58] Field of Search ..................................... 257/417, 254, 257/418, 420, 753; 73/514.21, 514.22, 514.23, 514.34, 514.36, DIG. 1, DIG. 4

[56] References Cited

U.S. PATENT DOCUMENTS

| | | | |
|---|---|---|---|
| 2,478,223 | 8/1949 | Argabrite | 73/DIG. 4 |
| 5,129,132 | 7/1992 | Zdeblick et al. | 29/25.35 |
| 5,209,119 | 5/1993 | Polla et al. | 73/723 |
| 5,216,631 | 6/1993 | Sliwa et al. | 365/174 |
| 5,293,041 | 3/1994 | Kruse, Jr. | 250/338.3 |
| 5,536,963 | 7/1996 | Polla | 257/417 |
| 5,578,845 | 11/1996 | Masuda et al. | 257/295 |
| 5,689,063 | 11/1997 | Fujiiu et al. | 73/105 |

FOREIGN PATENT DOCUMENTS

| | | |
|---|---|---|
| WO86/06548 | 11/1986 | WIPO . |
| WO92/09111 | 5/1992 | WIPO . |

OTHER PUBLICATIONS

IEEE 1989 Ultrasonics Symposium Proceedings, B.R. McAvoy, Oct. 3–6, 1989, vol. 2, pp. 1231–1235, "Coaxial Thin Film Transducers Based on PZT".

*Thin Film Solids,* Dec. 15, 1990 "Compositional and Microstructural Characterization of Thin Film Lead Zirconate Titanate Ferroelectrics", Maria Huffman, pp. 1017–1022, vol. 193/194, No. 1/2.

*1990 IEEE IEDM*: *Detectors, Sensors, and Displays,* "Lead Zirconate Titanate (PZT) Thin Films in Surface–Micromachined Sensor Structures", Takashi Tamagawa, Dennis L. Polla and Cheng–Chen Hsueh, 1990.

*Primary Examiner*—William Mintel
*Attorney, Agent, or Firm*—Patterson & Keough, P.A.

[57] ABSTRACT

A micromechanical device or microactuator based upon the piezoelectric, pyroelectric, and electrostrictive properties of ferroelectric thin film ceramic materials such as PZT. The microdevice has a device substrate and a deflectable component. The deflectable component is mounted for deflection on the device substrate and has a sensor/actuator. The sensor/actuator has first and second electrodes and a piezoelectric thin film disposed between the first and second electrodes. The thin film is preferably PZT. The sensor/actuator is disposed on a sensor/actuator substrate. The sensor/actuator substrate is formed of a material selected for being resistive to attack by hydrofluoric acid vapor. The invention also relates to a method for fabricating such micromechanical devices or microactuators.

13 Claims, 17 Drawing Sheets

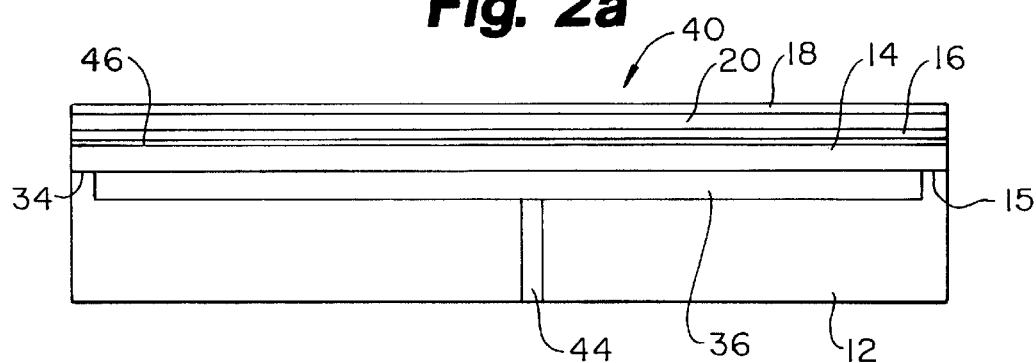
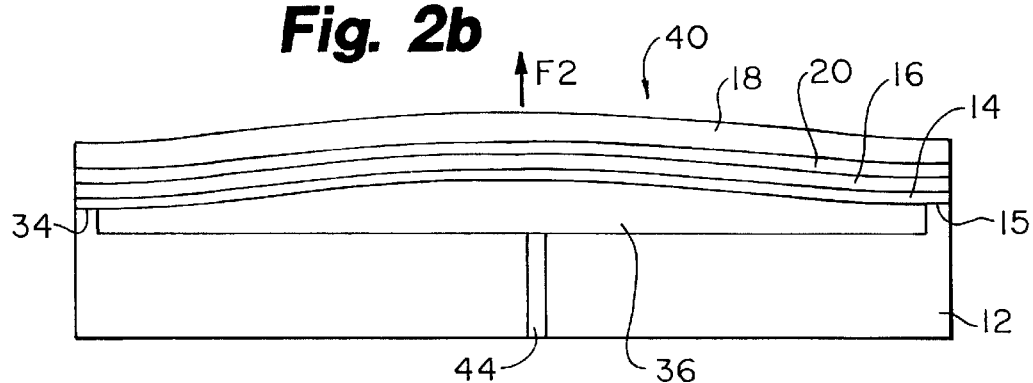
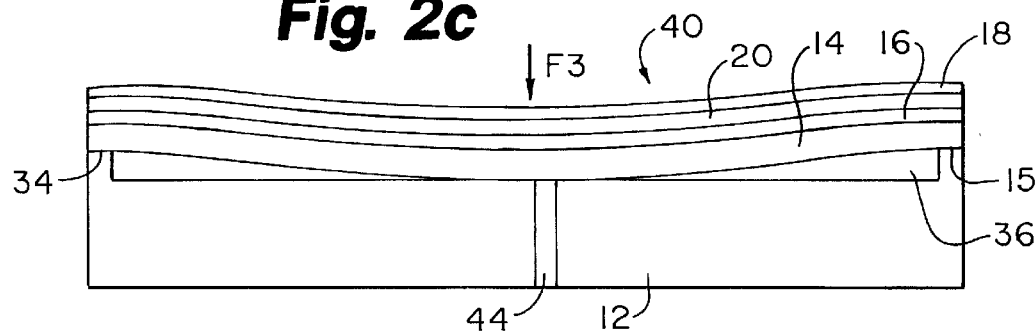
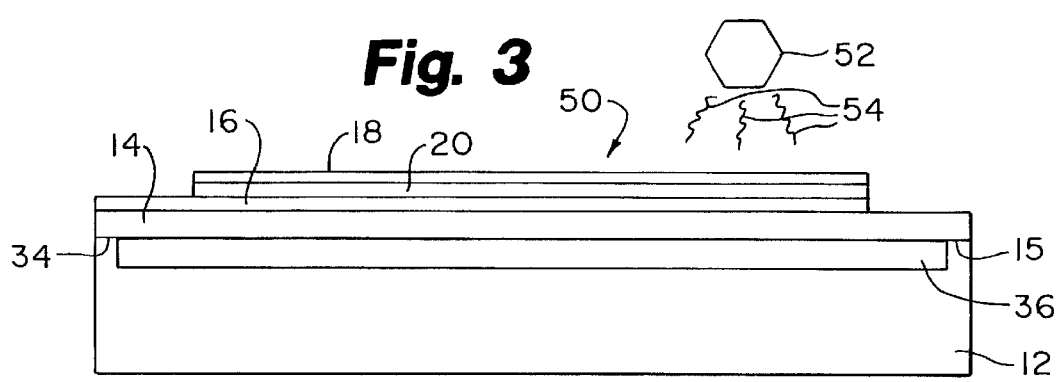

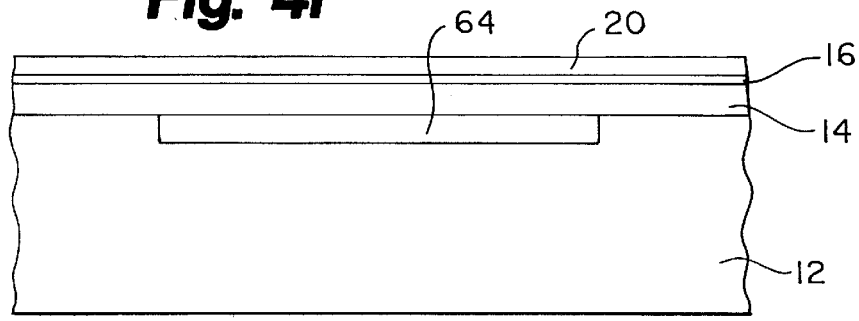
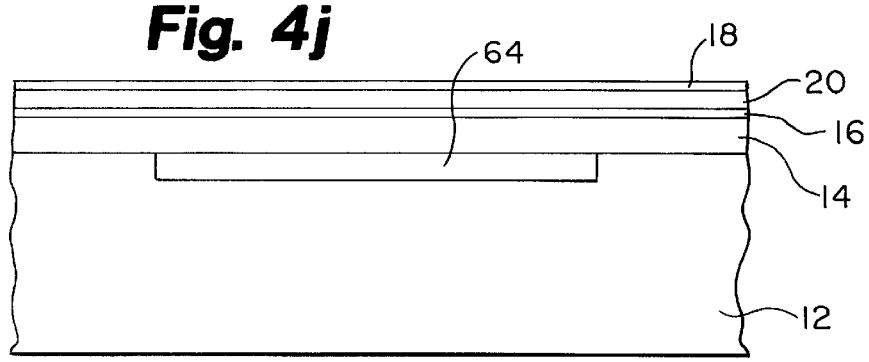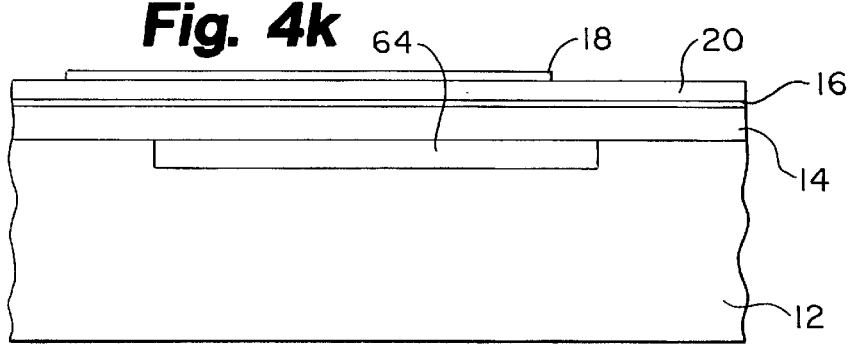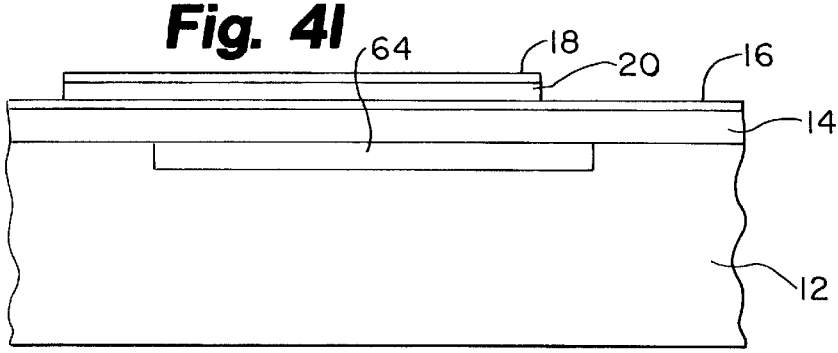

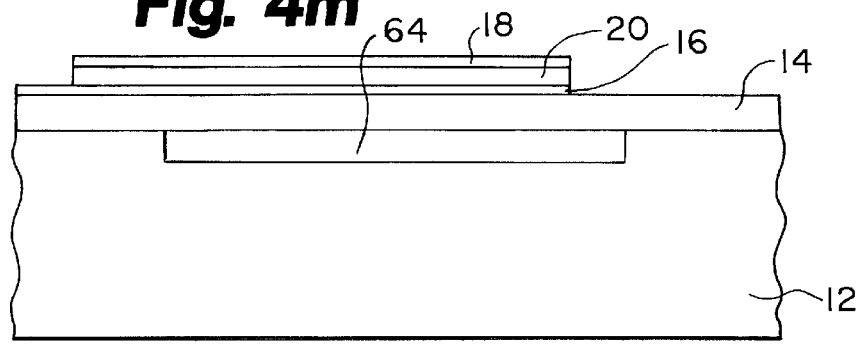
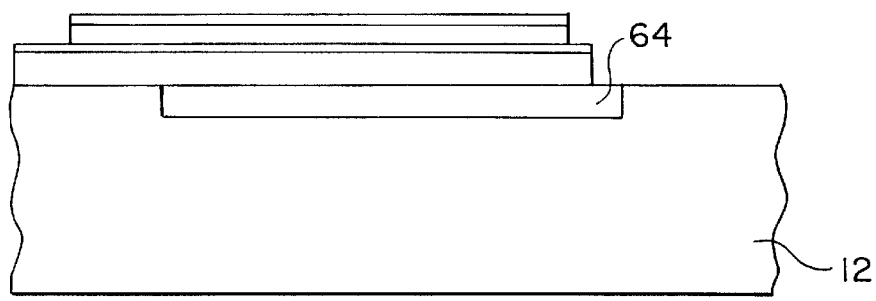
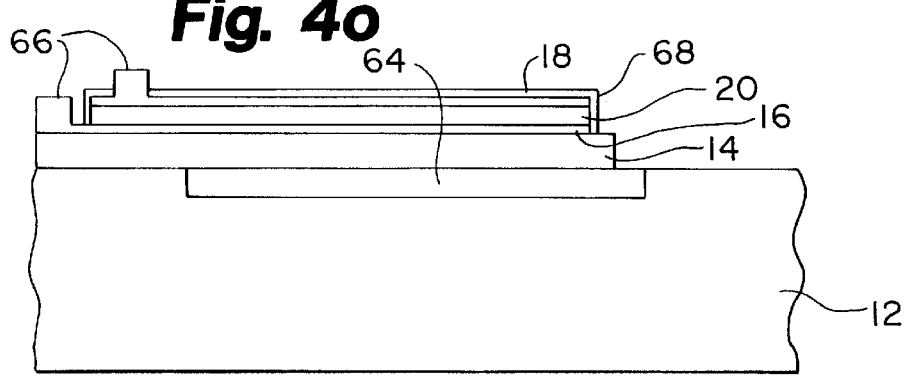
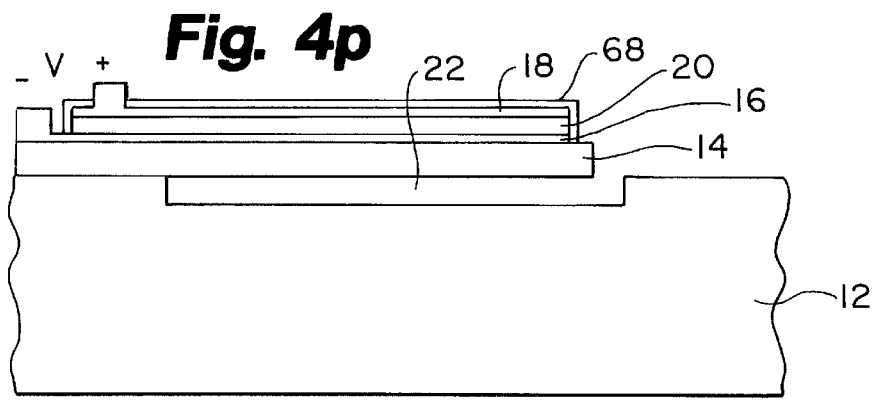

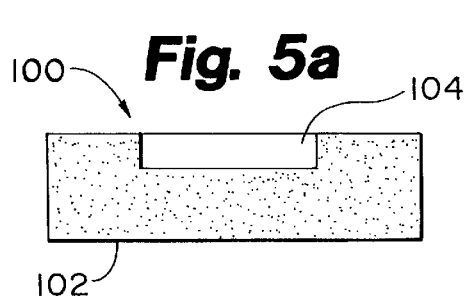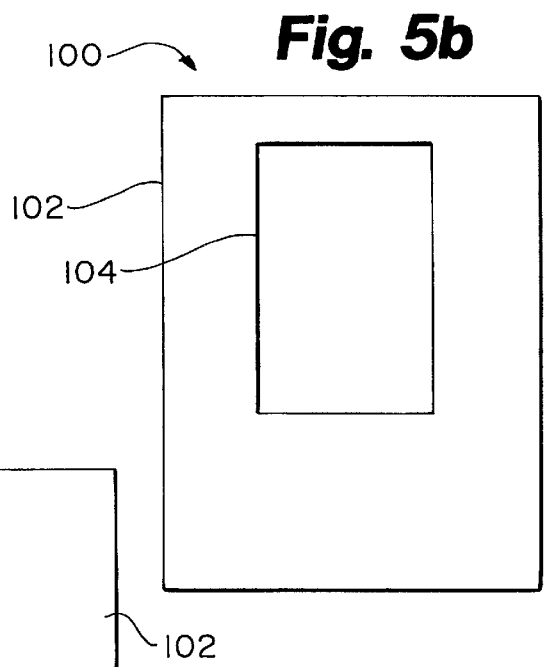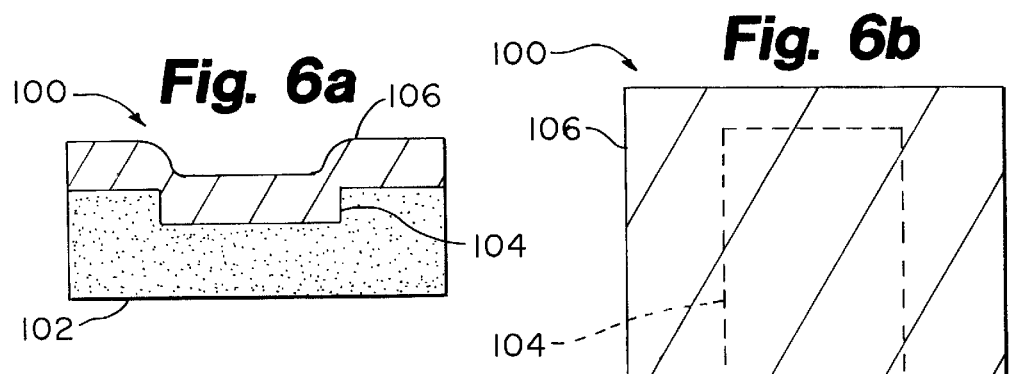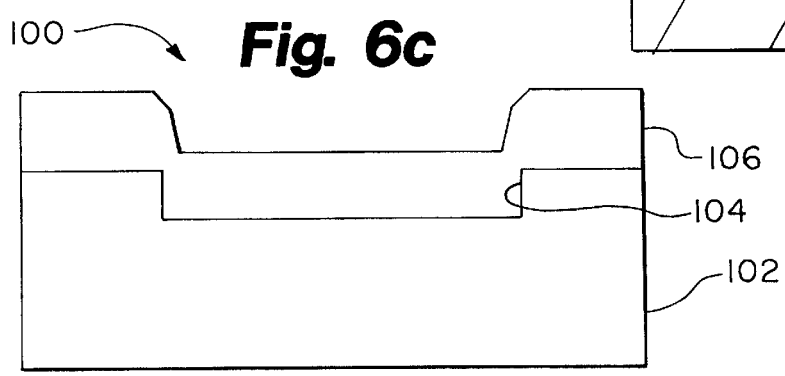

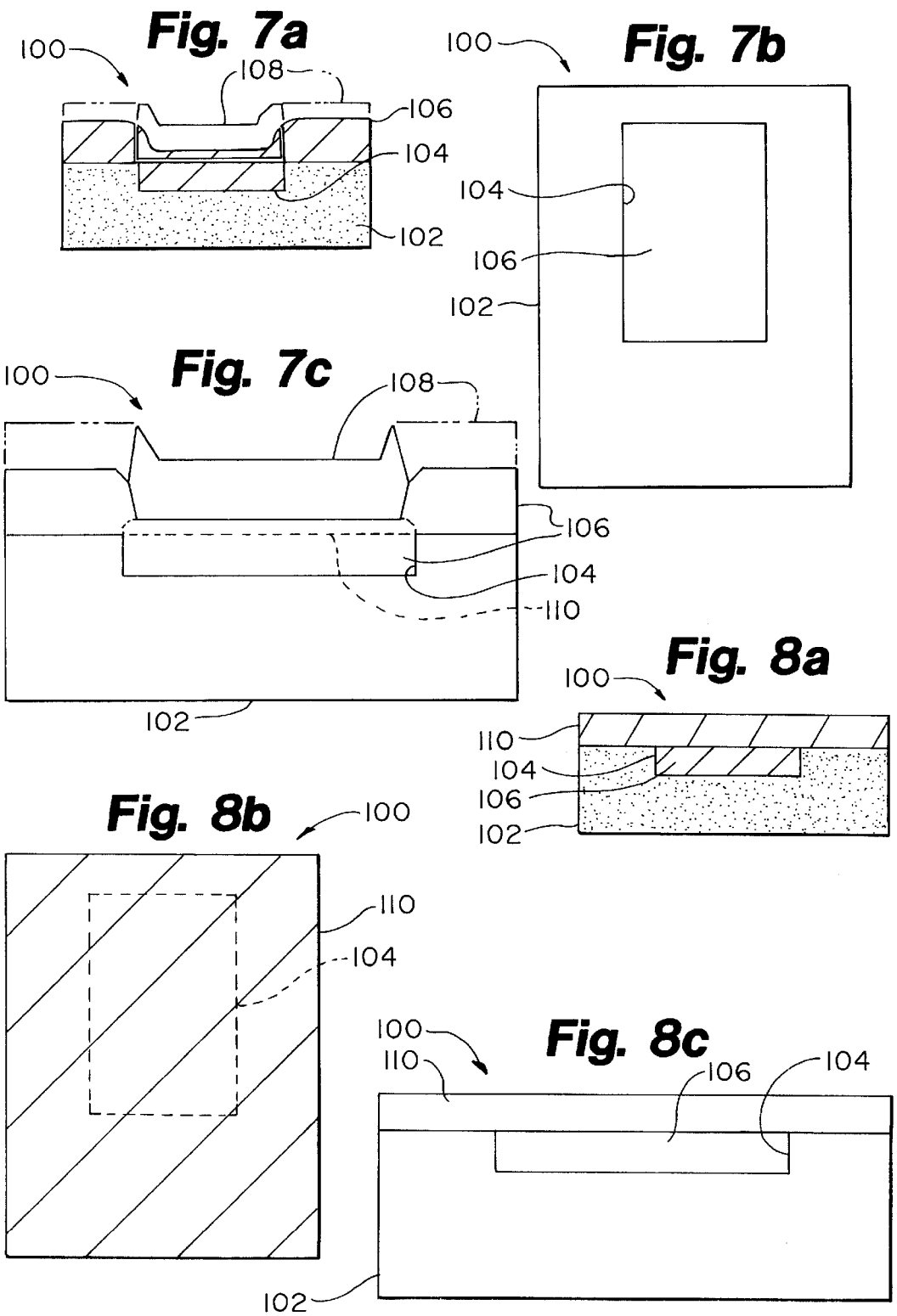

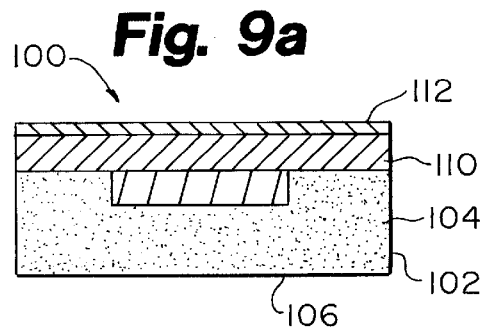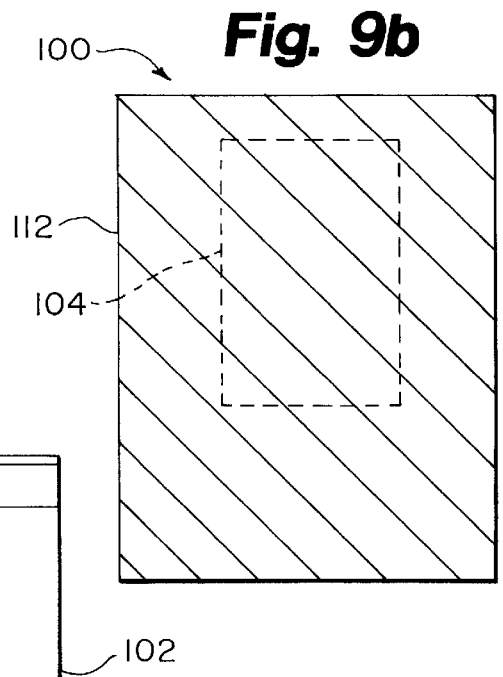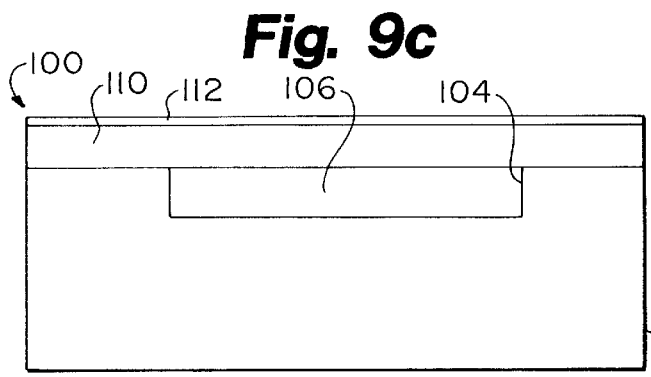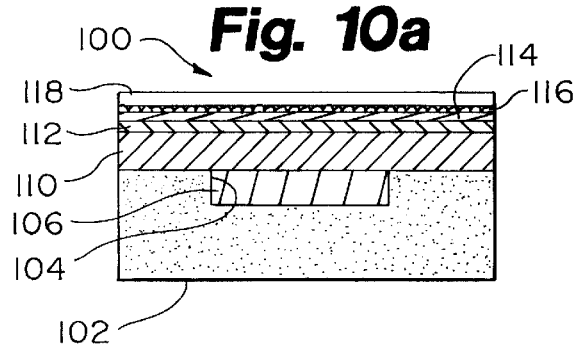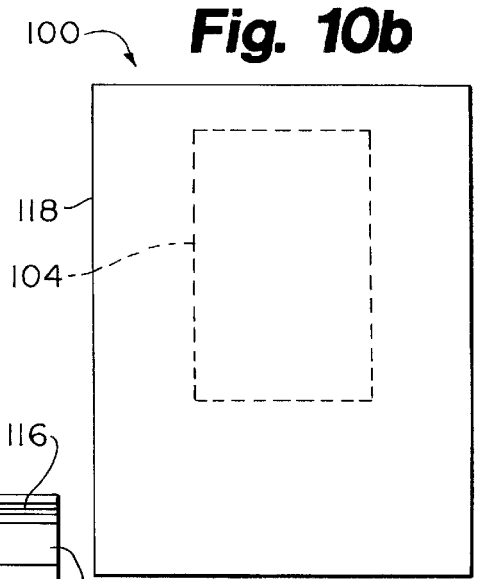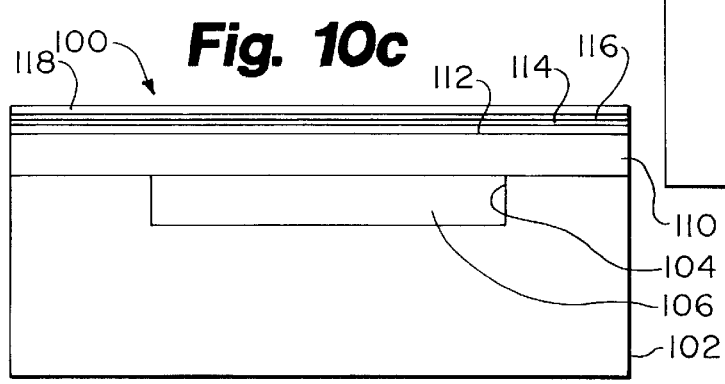

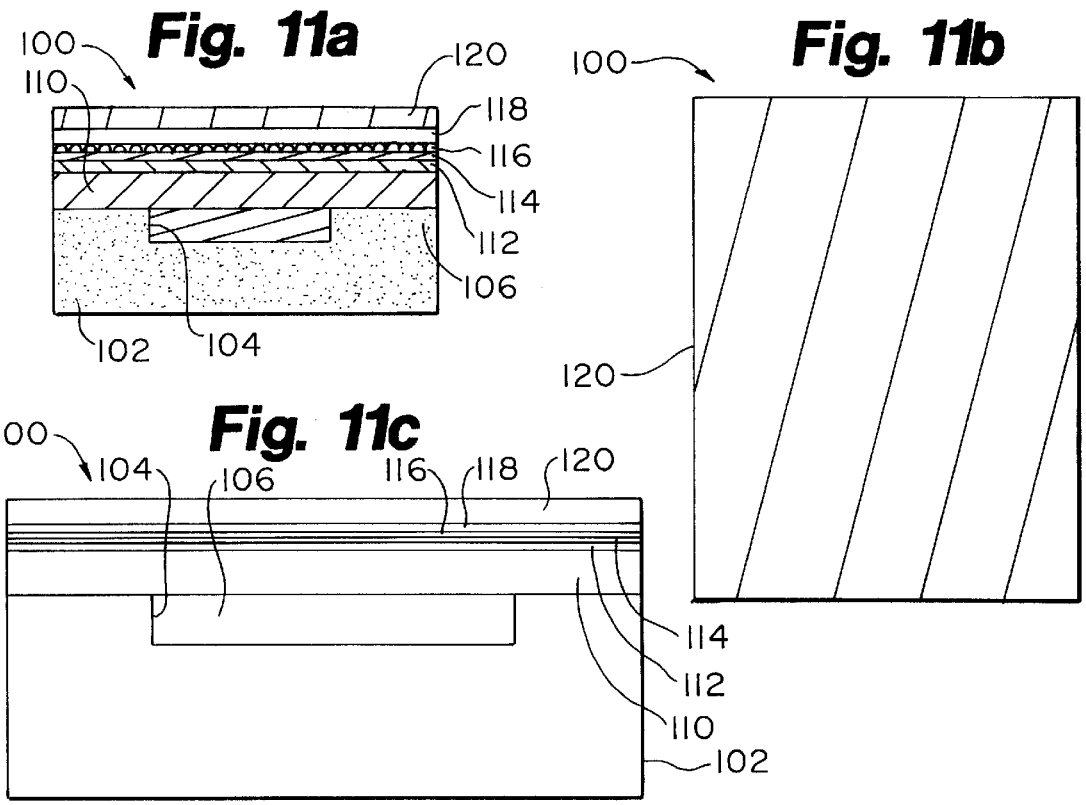
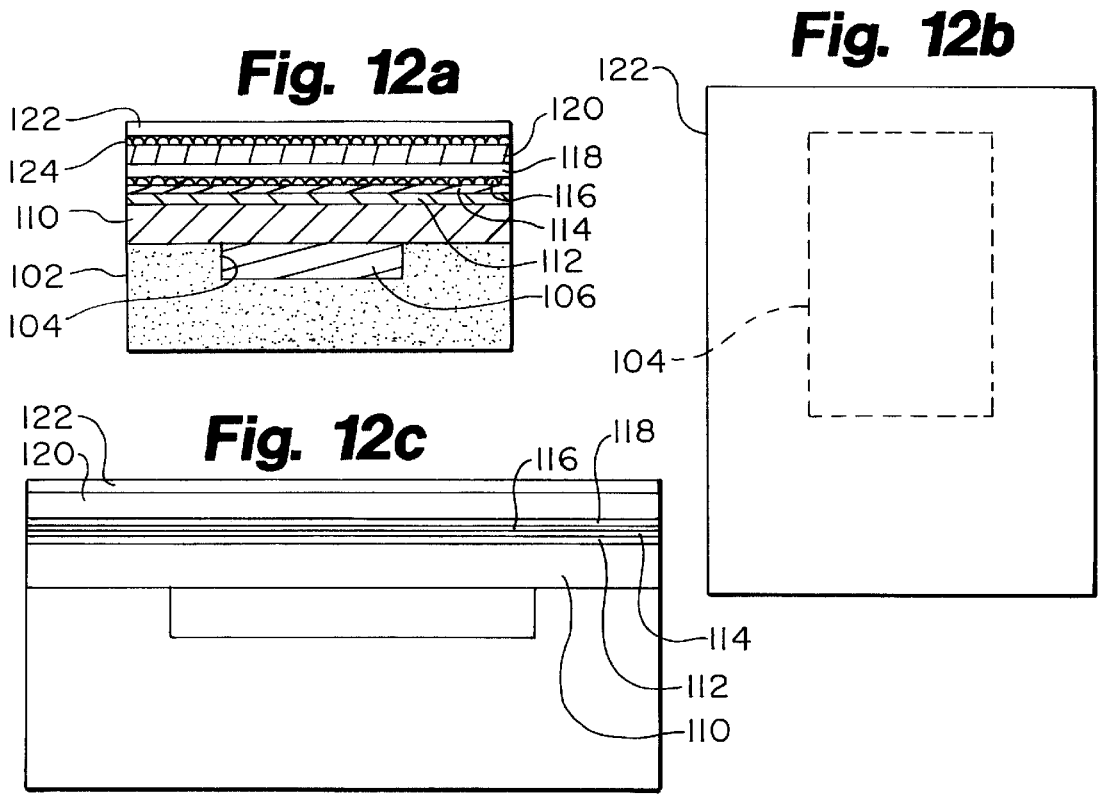

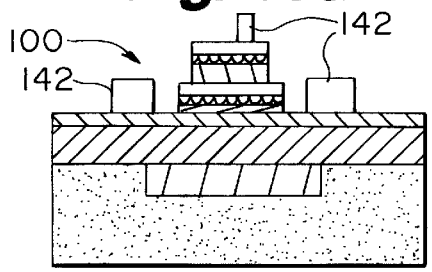
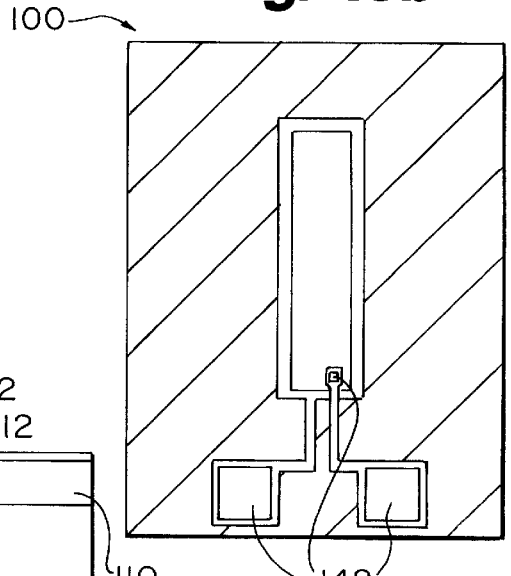
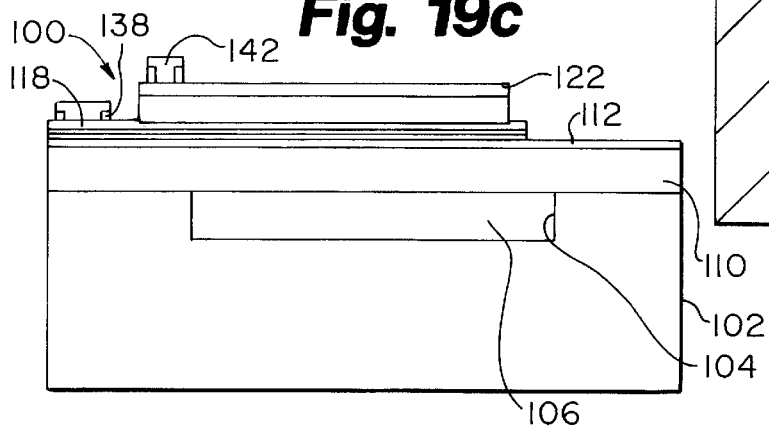
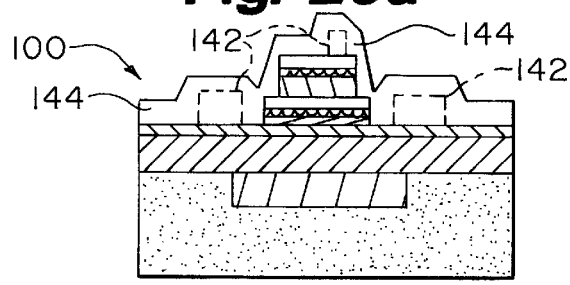
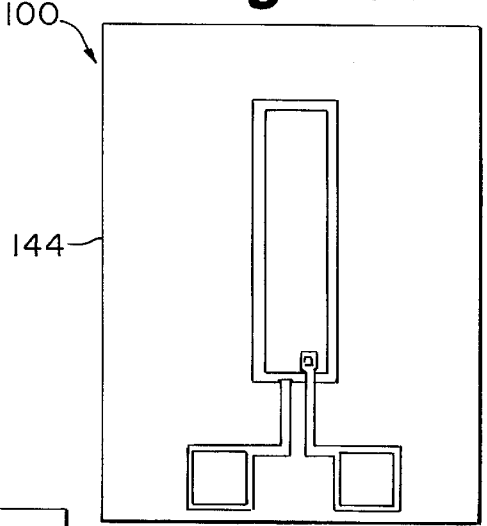
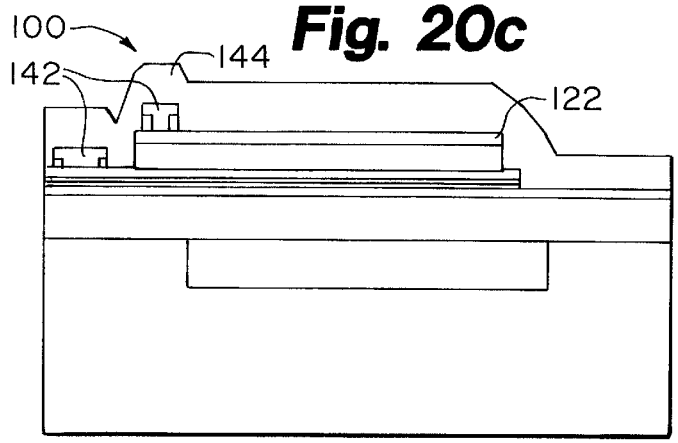

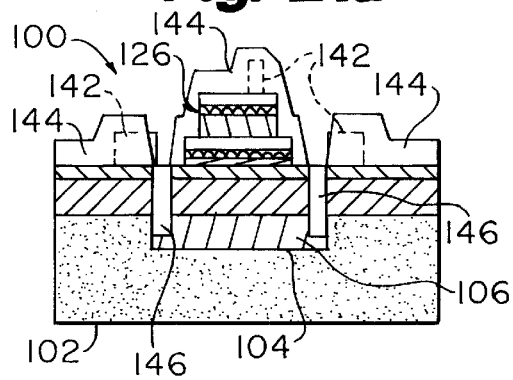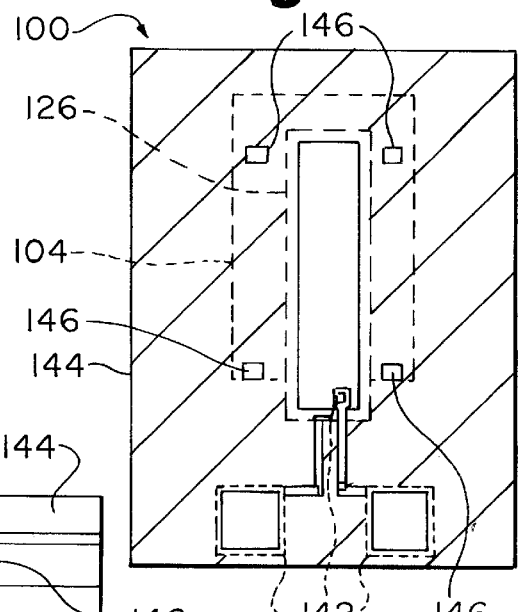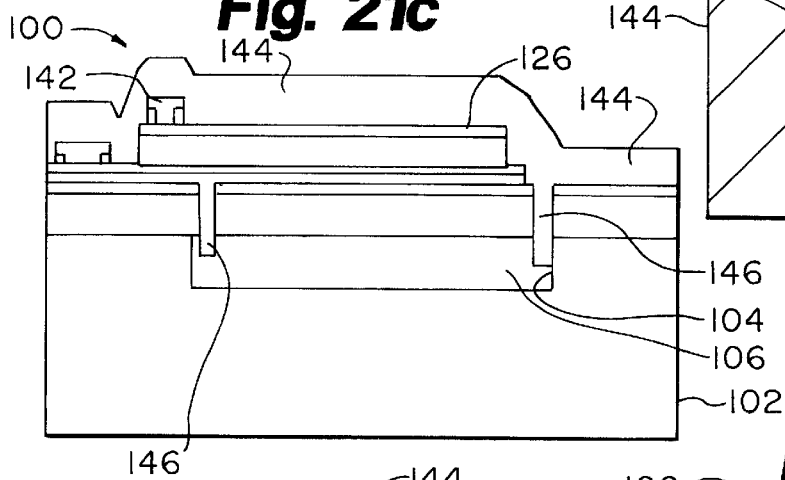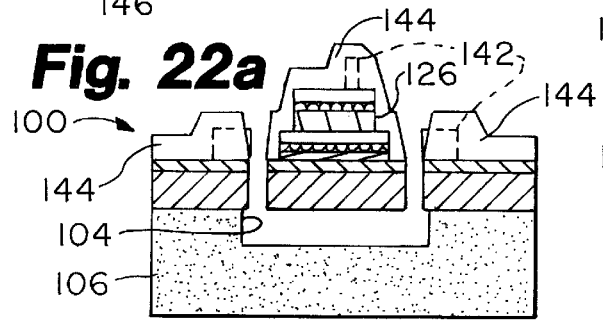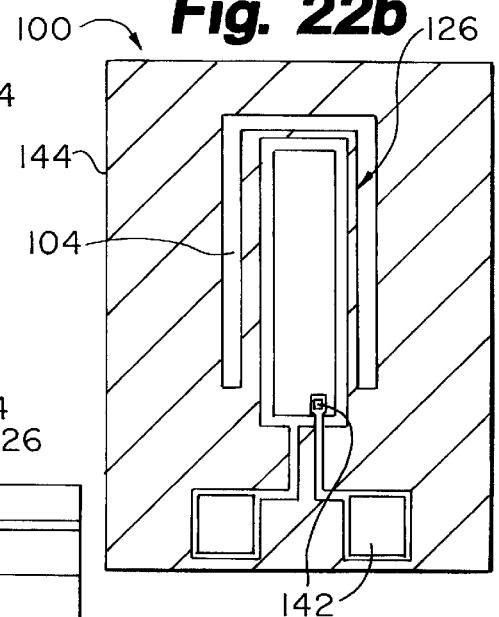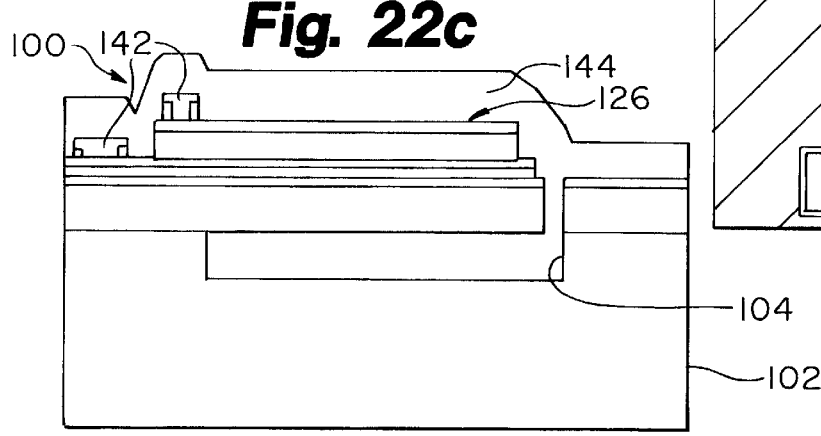

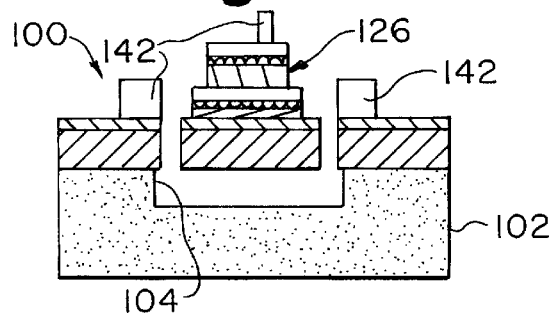
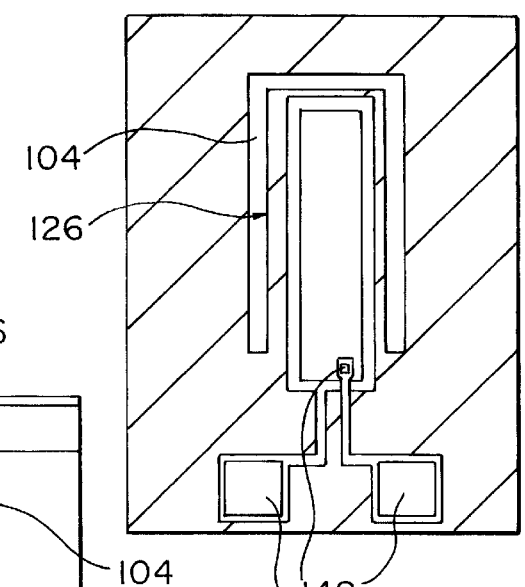
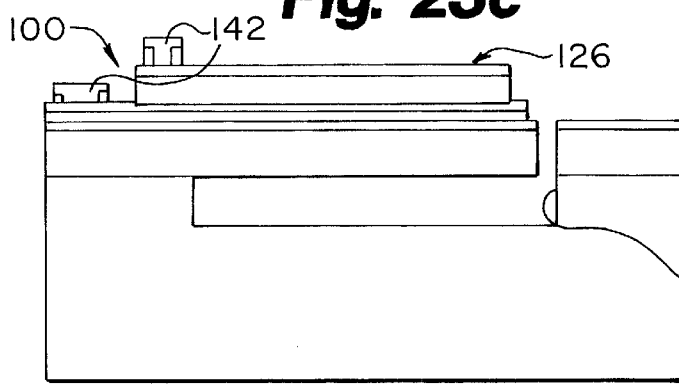
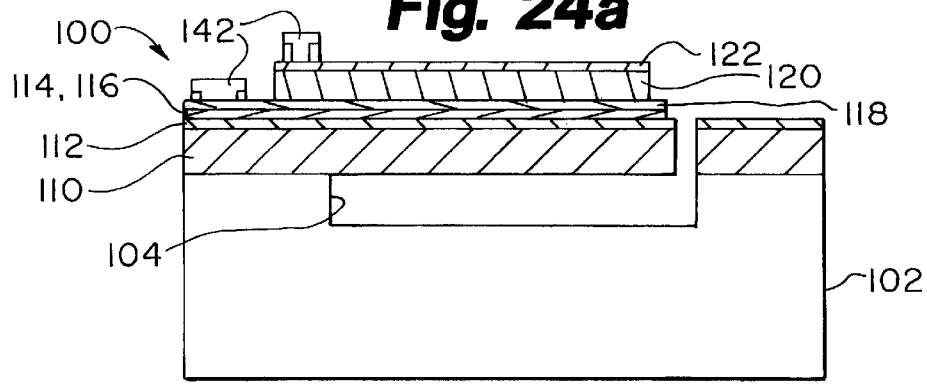
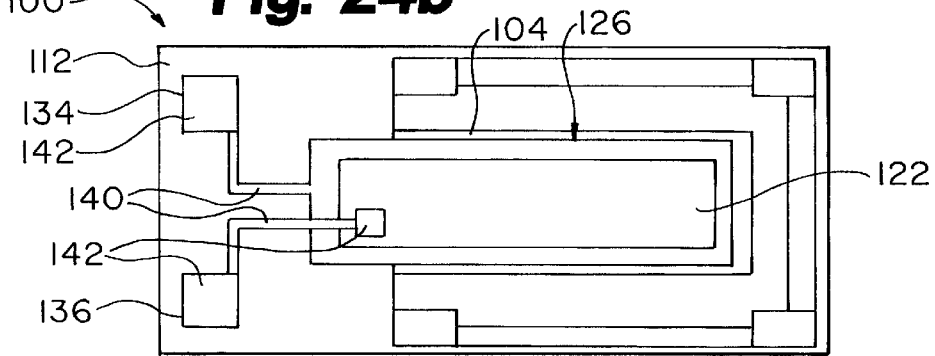

PZT MICRODEVICE

RELATED APPLICATIONS

This application is a continuation-in-part of U.S. application Ser. No. 08/680,920 filed Jul. 15, 1996 now abandoned, which is a continuation-in-part of U.S. application Ser. No. 08/241,052 filed May 11, 1994, now issued as U.S. Pat. No. 5,536,963.

BACKGROUND OF THE INVENTION

1. Field of the Invention

The present invention relates generally to a microdevice comprising a thin film of ferroelectric ceramic as the active actuating material and more particularly to a micromechanical sensor/actuator device having a deflectable piezoelectric (PZT) component and a fabrication process using surface micromachining techniques.

2. Description of Related Art

Microactuators such as micromechanical valves and pumps have previously been formed using thin film materials which deform in response to an applied electric field. Other micromechanical devices such as rotating members, micro motors, and microgears have also been fabricated using integrated circuit processing technology. These technologies, however, are severely limited in the amount of usable energy which can be derived from these actuation principles based on applied electrostatic forces. Much larger actuator devices have previously been formed using macro scale, bulk crystal and ceramic materials. These devices have been used in a number of micromechanical positioning applications and applications involving the production of substantially large forces in excess of one newton.

Piezoelectric thin films are attractive for MEMS (microelectromechanical system) devices such as microsensors and actuators. In MEMS devices the development of micro sensor and actuators, many microgeometry structures have been reported. These include membranes, bridges, and cantilevers which are constructed by bulk and surface micromachining techniques. In the case of the cantilever structure, many applications have been reported such as accelerometers. There are several different types of accelerometers which use cantilever beam structures, such as capacitive, piezoresistive, and piezoelectric effects. ZnO thin films have been used for micromachined piezoelectric cantilever beam accelerometer devices because of its easy deposition process. But, it is well known that PZT has much higher piezoelectric constants than ZnO, and consequently PZT thin films have been gathering much attention in the MEMS community. Recently, bulk micromachined cantilever beams using PZT thin films have been reported. However, no surface micromachined deflectable piezoelectric microdevices using PZT thin films have been reported to date.

There is a need for surface micromachined deflectable piezoelectric microdevices based on PZT thin film and for a suitable fabrication process for such microdevices.

SUMMARY OF THE INVENTION

In contrast to the prior art, embodiments of the present invention relate to a microactuator or micromechanical device which uses a thin film of ferroelectric ceramic materials primarily based on the Perovskite crystalline structure of the ceramic materials. In embodiments of the present invention the ferroelectric ceramic is applied as a thin film with thickness dimensions between about one tenth of a micrometer to ten micrometers and over an effective actuation area of less than about one square centimeter. The physical piezoelectric activity of such ferroelectric thin films and related ceramics has been shown to be significantly higher than pyroelectric materials; thus such materials are capable of delivering a substantially greater amount of usable energy than the previous known devices. Because of the high piezoelectric properties of certain formulations of the Perovskite material family, primarily based on lead zirconate titanate (PZT), such formulations are significantly attractive for both physical actuation as well as micromechanical deformation or movement applications.

Embodiments of the present invention also relate to a method of preparing microactuator and micromechanical devices using the piezoelectric and pyroelectric properties of the above mentioned ferroelectric ceramic thin films. One step of such method includes the deposition of the thin film ferroelectric ceramic onto a base electrode. Although various methods may be useful for the thin film deposition of the ferroelectric ceramics, the preferred method utilizes a sol-gel deposition technique. Other techniques, however, are also attractive. These techniques include thin film sputtering and vapor transport deposition methods.

With such sol-gel techniques, ferroelectric ceramic thin films can be deposited onto thin deformable microstructures formed of common metals, polycrystalline silicon, silicon nitride or thin polymers. The preferred material is based on silicon nitride prepared in a low tensile stress state. When a voltage is applied to such a structure, a stress is induced in the PZT thin film which generates a force resulting in a mechanical deformation or movement through its piezoelectric effect. This force can be transduced to move or position another object and contact with the microactuator structure can be used to open or close an orifice, can be used to mechanically constrict or open a fluid passageway, or can be used to selectively deflect incident matter in a desired direction. Typical microactuator applications for thin pyroelectric ceramic films include, among others, liquid dispensing application based on mechanical valves, gas and liquid pumping based on thin deformable diaphragm pumps, physical force generation used in achieving precision positioning such as in magnetic recording heads, and control of deflective surfaces for deflection of incident matter applications, such as altering the aerodynamic characteristics of an airfoil.

Because the thin film ferroelectric ceramic formulations of the present invention also have a high pyroelectric effect, heat sensitive microsensors can also be formed based upon this property by depositing the ferroelectric ceramic thin films on microstructures designed with a low thermal mass. With a structure, such as silicon nitride having a low thermal mass, negligible heat is dissipated to the underlying silicon wafer structure. With such a structure, change in the temperature of the thin film due to incident heat such as infrared radiation or heat, releasing chemical reactions, in turn produces a charge across the thin film as a result of the pyroelectric effect of the thin film. Such charge is detected and measured. From this, the temperature of the object generating the incident heat can be readily determined.

For micromechanical motion or actuator applications, the piezoelectric effect is utilized in the thin film electric ceramic to generate both force and displacement. In such applications, ferroelectric ceramic thin film is deposited onto an appropriate electrode associated with a free standing or partially unconstrained membrane, diaphragm or cantilever. A voltage is applied across the ferroelectric ceramic thin film which induces a volumetric expansion in the ferroelectric ceramic thin film through the inverse piezoelectric effect.

Mechanical movement or positioning of an attached load then results. Microactuation and nanoactuation applications include, among others, optical fiber positioning, opening and closing of mechanical valves, actuation of fluid pumps, positioning of information reading devices such as magnetic heads, microsurgery devices, and the like.

In particular, ferroelectric ceramic thin film formulations which are desired for exhibiting sufficient piezoelectric properties are primarily based on Perovskite crystalline structure. These materials commonly include lead zirconate titanate (PZT), lead titanate (PbTiO$_3$), lanthanum-doped or lanthanum-modified PZT (PLZT), lead zirconate (PbZrO$_3$), lanthanum-doped or lanthanum-modified lead titanate (PLT), neodymium-doped PZT (PNZT), lithium niobate (LiNbO$_3$), lithium tantalate (LiTaO$_3$) and other similar ceramic materials with a Perovskite crystalline structure. The above materials are all commonly prepared by sol-gel deposition techniques and are also compatible with thin film sputtering and vapor transport deposition methods.

A further aspect of the present invention involves making the microactuator or micromechanical device using micromachining or integrated circuit processing techniques. Thus, in its preferred form, the microactuator or micromechanical device of the present invention is mounted on a silicon wafer or die. In such an application, the effective actuation area of the thin film PZT is less than about one millimeter square. Further, unique techniques have been developed for building actuator devices based on cantilevered beams and suspended membranes.

The major fabrication steps for the microdevice of the present invention include first forming a 0.4~1.0 μm deep in a trench area in a 76-mm dia. silicon wafer by reactive ion etching. This is followed by a PSG filling deposition to form a sacrificial layer. The PSG layer is then patterned and made the same height as the silicon wafer. The next step is deposition of a structure layer for the deflectable component, in this case a cantilever beam. A layer of low stress LPCVD silicon nitride, 1.5 μm thick, is deposited as the substrate for the deflectable component. The low stress LPCVD silicon nitride layer has very good etch selectivity with respect to the PSG sacrificial layer.

The next step is the deposition of the bottom electrode for the PZT thin films. LPCVD polysilicon, TiO$_2$ and Ti layers are deposited before the platinum lower electrode is deposited. These layers are very helpful in increasing the adhesion between the silicon nitride layer and the bottom platinum electrode. Adhesion is important because the beam is a dynamic structure.

After deposition of the bottom electrode, PZT thin films are deposited by spin coating with the solution made by a metal-organic decomposition (MOD) method. After finishing the crystallization process of PZT, the top electrode is deposited. The top electrode, the PZT layer, and the bottom electrode are then patterned by ion milling. An encapsulation layer is deposited and patterned. A plurality of bores are etched in the encapsulation layer to admit an HF vapor etchant to remove the PSG sacrificial layer in the trench area. After the etching the sacrificial layer, connections are made from a bonding pad to the top electrode and finally the silicon nitride encapsulation layer is removed to complete the fabrication process.

It was found that the post annealing process for the polysilicon/silicon nitride/silicon substrate at 950° C. for 60 minutes greatly improves the dielectric and hysteresis characteristics of the PZT thin film. Additionally, a single layer PECVD silicon nitride and chromium layer for encapsulation is not strong enough to prevent the HF vapor from attacking device during etching of the PSG sacrificial layer. A double photoresist layer deposited on the PECVD silicon nitride layer does protect the device such as the PZT, Ti, and TiO$_2$ from the HF vapor.

Embodiments of the present invention include a micromechanical device or microactuator based upon the piezoelectric, pyroelectric, and electrostrictive properties of ferroelectric thin film ceramic materials such as PZT. The microdevice has a device substrate and a deflectable component. The deflectable component is mounted for deflection on the device substrate and has a sensor/actuator. The sensor/actuator has first and second electrodes and a piezoelectric thin film disposed between the first and second electrodes. The thin film is preferably PZT. The sensor/actuator is disposed on a sensor/actuator substrate. The sensor/actuator substrate is formed of a material selected for being resistive to attack by hydrofluoric acid vapor. The invention also relates to a method for fabricating such micromechanical devices.

BRIEF DESCRIPTION OF THE DRAWINGS

FIG. 2a is a side elevational view of a micromechanical pump made according to the present invention;

FIG. 2b is a side elevational view of the micromechanical pump of FIG. 2a depicted in the upward deflected position;

FIG. 2c is a side elevational view of the micromechanical pump of FIG. 2a depicted in the downward deflected position;

FIG. 3 is a side elevational view of a micromechanical heat sensor made according to the present invention;

FIG. 5a is an end sectional view of the device of the present invention with the section extending through the trench portion thereof;

FIG. 5b is a top plan form view;

FIG. 5c is a side sectional view with the section extending through the trench portion of the device;

FIG. 6a is an end sectional view of the device with a layer of PSG formed on the substrate with the section extending through the trench portion of the device;

FIG. 6b is a top plan form view of the device with the trench depicted in phantom;

FIG. 6c is a side sectional view of the device of FIG. 6c with the section extended through the trench portion of the device;

FIG. 7a is an end sectional view of the device with a layer of photoresist generally overlying the trench portion thereof with the section extending through the trench portion;

FIG. 7b is a top plan form view of the device after planarization by removal of the PSG on the substrate;

FIG. 7c is a side sectional view with a layer of photoresist generally overlying the trench portion;

FIG. 8a is an end sectional view of the device with a layer of silicon nitride formed on the upper surface of the device with the section extending through the trench portion thereof;

FIG. 8b is a top plan form view;

FIG. 8c is a side sectional view of the device of FIG. 8b with the section extending through the trench portion thereof;

FIG. 9a is an end sectional view of the device with a layer of undoped polysilicon formed on top of the silicon nitride with the section extending through the trench portion thereof;

FIG. 9b is a top plan view of the device;

FIG. 9c is a side sectional view of the device of FIG. 9b with the section extending through the trench portion of the device;

FIG. 10a is an end sectional view of the device with successive layers of a titanium dioxide, titanium and platinum formed on top of the polysilicon with the section extending through the trench portion thereof;

FIG. 10b is a top plan form view of the device with the trench portion depicted in phantom;

FIG. 10c is a side sectional view of the device of FIG. 10b with the section extending through the trench portion thereof;

FIG. 11a is an end sectional view of the device with a layer of PZT formed on the upper surface thereof with the section extending through the trench portion;

FIG. 11b is a top plan form view depicting the PZT layer;

FIG. 11c is a side sectional view of the device of FIG. 11b;

FIG. 12a is an end sectional view with successive layers of titanium and platinum formed on the PZT layer with the section extending through the trench portion thereof;

FIG. 12b is a top plan form view of the device depicting the layer of platinum with the trench portion depicted in phantom;

FIG. 12c is a side sectional view of the device of FIG. 12b;

FIG. 17a is a end sectional view depicting a layer of aluminum deposited on the device of FIG. 16a;

FIG. 18a is an end sectional view of the device after patterning and etching the aluminum layer depicted in FIG. 17a;

FIG. 19a is an end sectional view of the device after etching of the silicon nitride depicted in FIG. 18a;

FIG. 19b is a top plan form view of the device;

FIG. 19c is a side sectional view of the device of FIG. 19b;

FIG. 20a is an end sectional view of the device depicting an encapsulation layer formed on the device of FIG. 19a;

FIG. 20b is a top plan form view depicting the encapsulation layer formed over the beam and electrodes depicted in phantom;

FIG. 20c is a side sectional view of the device of FIG. 20b;

FIG. 21a is an end sectional view of the device of FIG. 20a including a plurality of vertical bores etched therein;

FIG. 21b is a top plan form view of the device depicting the shafts disposed proximate the beam depicted in phantom;

FIG. 21c is a side sectional view of the device of FIG. 21b;

FIG. 22a is an end sectional view of the device of FIG. 21a after etching by HF vapor admitted to the plurality of vertical bores;

FIG. 22b is a top plan form view of the device depicting the trench defined beneath the beam after etching by the HF vapor;

FIG. 22c is a side sectional view of the device of FIG. 22b;

FIG. 23a is an end sectional view of the device of FIG. 22a after removal of the remainder of the encapsulating layer;

FIG. 23b is a top plan form view of the device of FIG. 23a;

FIG. 23c is a side sectional view of the device of FIG. 23b;

FIG. 24a is a side sectional view of the completed microdevice of the present invention.

DETAILED DESCRIPTION OF THE PREFERRED EMBODIMENTS

Aspects of the present invention relate to a microsensor, microactuator or micromechanical structure using the piezo electric or pyroelectric properties of certain formulations of the Perovskite ceramic material structure. Further features of embodiments of the present invention include among others the specific ferroelectric ceramic formulations which exhibit the desirable piezoelectric properties for the specific application contemplated, the utilization of sol-gel deposition techniques for depositing and creating thin film ferroelectric ceramic thin films and the utilization of integrated circuit or micromachine processing techniques in the formation of the microsensor and micromechanical devices. These and other features of the present invention will be described in greater detail below.

Figure 1A:
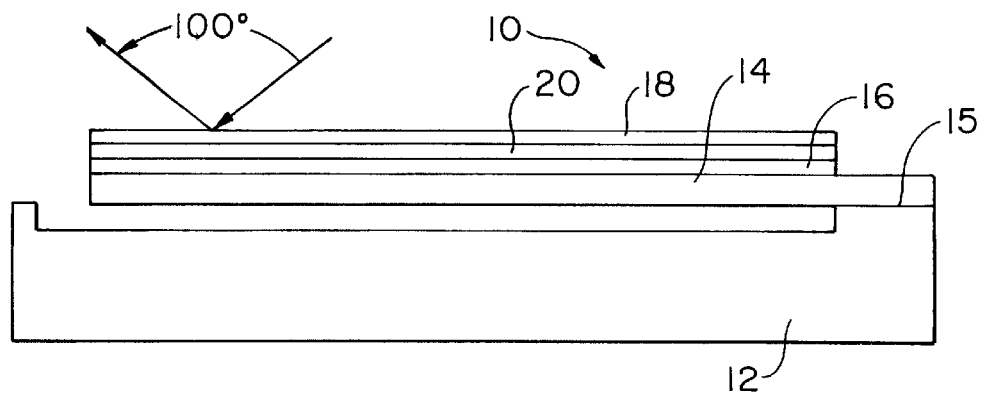
FIG. 1a is a side elevational view of a micromechanical deflector made according to the present invention.

The micromechanical deflector of the present invention is depicted generally at 10 in FIG. 1a. The micromechanical deflector 10 is formed on a silicon wafer or die 12. A cantilever support structure 14 is anchored at a first end 15 to the silicon wafer 12. The support structure 14 is preferably formed of silicon nitride material.

The micromechanical deflector 10 further includes the base or first electrode 16, a top or second electrode 18, and a thin film of ferroelectric ceramic material 20 formed between the electrodes 16, 18. Electrical connection means (not shown) in the form of an electrical lead electrically connects each of the electrodes 16, 18 respectively to opposite poles of a voltage source or battery (not shown).

Figure 1B:
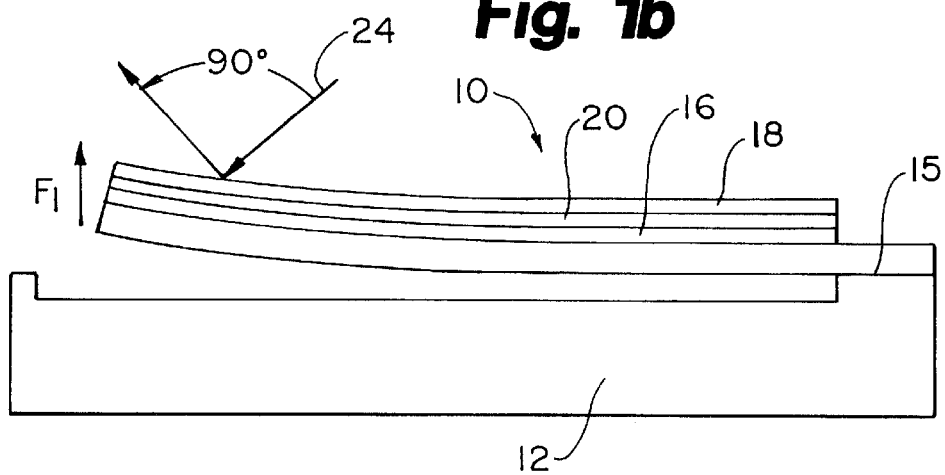
FIG. 1b is a side elevational view of the micromechanical deflector of FIG. 1a depicted in the upward deflecting position.

When a voltage or electric potential is applied to the electrodes 16, 18 and across the ferroelectric thin film ceramic material 20 formed therebetween, certain stresses are generated within the ferroelectric thin film ceramic material 20. This in turn produces a mechanical movement or deformation between the electrodes 16, 18 as a result of the piezoelectric property of the ferroelectric ceramic thin film 20. Such mechanical movement or deformation is indicated by the arrow $F_1$ depicted in FIG. 1b. This movement can be used to selectively deflect incident matter 24. As depicted in FIG. 1a, the incident matter 24 is deflected at an included angle of approximately 100 degrees. After the deformation depicted in FIG. 1b, incident matter 24 that is impinging upon the micromechanical deflector 10 at the same angle as the matter 24 depicted in FIG. 1a, is deflected at an included angle of approximately 90 degrees.

Figure 1C:
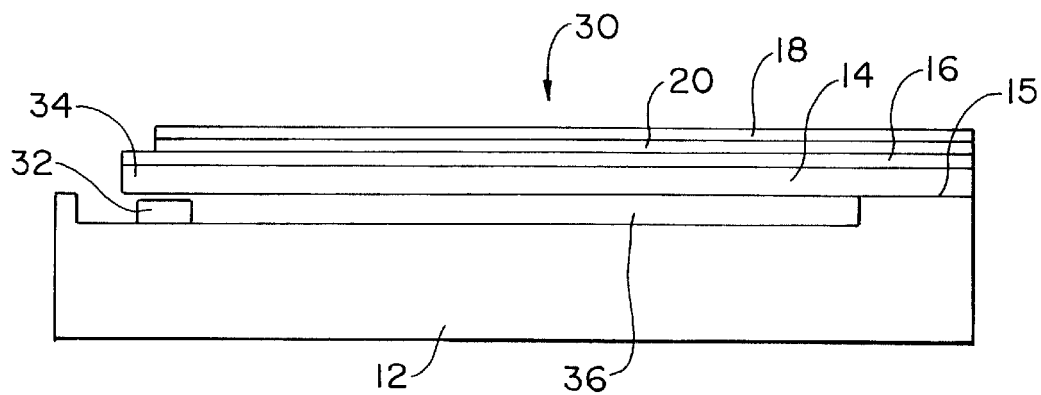
FIG. 1c is a side elevational view of a micromechanical valve made according to the present invention.

FIG. 1c depicts a micromechanical valve generally at 30. The micromechanical valve 30 is of similar construction as the micromechanical deflector 10, with the inclusion sealing pedestal 32. Sealing pedestal 32 is preferably formed of a polycrystalline silicon. With no voltage applied to the electrodes 16, 18, the second end 34 of the support structure 14 rests on sealing pedestal 32 and defines a sealed space 36 within the micromechanical pump 30. A fluid may be sealingly confined within sealed space 36 or a fluid may surround the micromechanical valve 30 and the sealed space 36 may be evacuated. In the first case, as the deformation depicted in FIG. 1b occurs, the support structure 14 separates from the sealing pedestal 32 and the fluid that is confined within sealed space 36 is released. In the second case, as the deformation depicted in FIG. 1b occurs, the fluid surrounding the micromechanical valve 30 is free to enter the sealed space 32. In both cases, the micromechanical valve 30 acts to effect the fluid flow from one region to another region as desired.

In the micromechanical device application of FIG. 2a, a micromechanical pump is depicted generally at 40. The micromechanical pump 40 differs from the embodiment of the micromechanical deflector 10 depicted in FIG. 1a in that the support structure 14 is not cantilevered. Both the first end 15 and the second end 34 of the support structure 14 are bonded to the silicon wafer 12. This bonding defines a sealed space 36 within the micromechanical pump 40. A fluid passageway 44 is defined in the silicon wafer 12. Such fluid passageway 44 permits a fluid to be emplaced within the sealed space 36. The sealed space 36 then acts as a fluid reservoir.

FIG. 2a also depicts an insulative layer 46 that is formed between the first electrode 16 and the ferroelectric thin film ceramic material 20. Such insulative layer 46 is an optional element that is utilized to prevent chemical reactions and chemical diffusion from first electrode 16 to the ferroelectric thin film ceramic material 20.

FIG. 2b depicts the result of imposing an electrostatic charge on the electrodes 17, 18. Such electrostatic charge has a known polarity. Application of an electrostatic charge via a battery (not shown) produces a corresponding electrostatic charge across the electrodes 16, 18. This, in turn, causes a force or movement to be generated in the direction of the arrow $F_2$ as a result of the piezoelectric properties of the thin film PZT 20. Because the generated force or movement $F_2$ will be proportional to the magnitude of the applied electrostatic charge, such force or movement can be varied by correspondingly changing the electrostatic charge. This can be done with rheostats, switches on chip transistors or other components common in the art.

The deformation that is depicted in FIG. 2b may be utilized to draw a fluid into the sealed space 36. The deformation may also be utilized to apply pressure to a fluid that surrounds the micromechanical pump 40 and to pump such fluid as desired.

FIG. 2c depicts the micromechanical pump 40 having the opposite deformation as that depicted in FIG. 2b. Such deformation results from imposing an electrostatic charge across the electrodes 16, 18 that is of the opposite polarity as the electrostatic charge imposed across the electrodes 16, 18 that resulted in the deformation as depicted in FIG. 2b. Such deformation results from the force indicated at $F_3$. The deformation depicted in FIG. 2c may be utilized to expel a fluid from the sealed space 36. The fluid may be, for example, a therapeutic drug to be delivered from an implanted pump to a patient in nanoliter quantities. A plurality of micromechanical pumps 40 may be incorporated within the pump implanted within the patient.

In the micromechanical device application of FIG. 3, a pyroelectric infrared detector is depicted generally at 50. As with previous embodiments, a thin film of ferroelectric ceramic material 20 is sandwiched between a base or first electrode 16 and the top or second electrode 18. It is important to realize that the thin film of ferroelectric ceramic material 20 is the same as previously disclosed. In this application, however the pyroelectric properties of the ferroelectric ceramic material 20 are being exploited as distinct from the deformation properties.

Electrical connection means (not shown) in the form of the electrical leads electrically connect the electrodes 16 and 18, respectively, with a volt meter or other electric potential sensing device. Exposure of the infrared detector 50 to incident radiation from a body 52, such as thermal radiation 54 given off by warm objects, produces a charge on the electrodes 16, 18 surrounding the pyroelectric ceramic material 20. This in turn causes a voltage to be produced and sensed by the connected multimeter or volt meter (not shown) connected to the infrared detector 50. The amount of charge generated or voltage produced is proportional to the intensity of the warm object. The warm body 52 heats the pyroelectric ceramic material 20 thereby changing the internal dipole moment of the oriented ferroelectric ceramic material 20. An electrical signature characteristic of the temperature of the warm body 52 is read out with a voltmeter, multimeter, or other appropriate charge or electric potential sensing device.

The thickness of the thin film PZT 20, as depicted in the above described embodiments, will be determined by several factors, including, among others, the particular piezoelectric properties desired, the specific application of the device and the method utilized to deposit the thin film 20. Generally, for applications contemplated by the present invention, the PZT film 20 will be between about 0.1 and 5 microns. For applications as a microsensor illustrated in FIG. 3, the preferred thickness of the PZT film 20 is between about 0.1 and 1.0 microns and preferably about 0.5 microns. For applications as a micromechanical device illustrated in FIGS. 1a, 1b, 1c, 2a, 2b, and 2c, the preferred thickness of the PZT film 20 is between about 1.0 and 5 microns and most preferably about 2.0 microns.

In the preferred embodiment, the formulation of the ferroelectric ceramic material 20 is selected so that its piezoelectric and pyroelectric properties are optimized for the particular application desired. For certain applications contemplated by the present invention, the particular ferroelectric ceramic formulation is one that exhibits and possesses a Perovskite crystalline structure. Preferably a formulation based on lead zirconate titanate (PZT) comprises a zirconate to titanate ratio from about 94:6 to about 30:70. Most preferably, the PZT composition comprises a zirconate titanate ratio of about 54:46 or composition near the morphotrophic phase boundary of the material 20. Additional incorporation of dopants such as lanthanum or niobium are used to modify the dielectric properties of the ferroelectric ceramic material 20. Such dopants also influence the piezoelectric and pyroelectric performance properties of the ferroelectric ceramic material 20. In particular, the intentional incorporation of lanthanum with a composition of approximately nine percent produces an extremely large electrostrictive effect in the PZT ceramic material 20. This in turn allows extremely large deflections to be produced in the applications described in FIGS. 1a, 1b, 1c, 2a, 2b, and 2c. The intentional incorporation of lanthanum with a composition of approximately three percent in PZT or lead titanate (PT) has the effect of reducing the dielectric loss associated with the ferroelectric ceramic material 20. This is extremely important in improving the pyroelectric response and signal to noise ratio of the infrared detector structures contemplated in this invention as depicted in FIG. 3.

The thickness of the thin film ferroelectric materials 20 is determined by several factors including, among others, the particular piezoelectric or pyroelectric properties desired, the specific application of the device, the method utilized to deposit the film, and practical restraints associated with integrated circuit processing methods, photolithography and micromachining techniques. Generally, for other applications contemplated by the present invention the ferroelectric ceramic film 20 will be between about 0.1 and 10 micrometers. For applications as a infrared detector 50 illustrated in FIG. 3, the preferred thickness of the ferroelectric ceramic material is approximately between 0.1 and 1 micrometer and preferably about 3000 angstroms or 0.3 micrometers. For the pyroelectric detector 10 application of the present invention the preferred ferroelectric ceramic material composition is lead titanate or lanthanum-doped lead titanate. For applications as a micromechanical device 10, 30, and 40, illustrated in FIGS. 1a, 1b, 1c, 2a, 2b, and 2c, the preferred thickness of the ferroelectric material 20 is between about 0.2 and 5 micrometers and most preferably about 0.5 micrometers. The preferred material composition of the ferroelectric ceramic is PZT with a composition of 54:46.

The terms microdevice or microsensor and micromechanical device as used herein are intended to mean sensor, actuator and mechanical devices which are formed on a semiconductor substrate such as a silicon wafer or die 12 for use in the formation of a chip. Generally, such wafers 12 have a thickness of between about 0.2 and 2 mm and preferably less than 1 mm. It is contemplated that the size of the effective sensing or actuation portion of the thin film ferroelectric ceramic 20 on such wafers 12 is less than about one millimeter square ($10^6$ square microns) and greater than about 5 microns square. The effective portion of the ferroelectric ceramic film 20 is that portion of the film 20 between the electrodes 16, 18.

The structure of the electrodes 16, 18 in FIGS. 1a, 1b, 1c, 2a, 2b, and 2c, and 3 may be selected from a variety of metals commonly used as electrodes. The particular material which is preferred will depend on various functions including, among others, the method of producing the thin film ferroelectric ceramic 20 and the particular application of the device. Of the electrodes 16, 18, the base electrodes 16 are most important since the electrodes 16 are the electrodes on which the ferroelectric ceramic material 20 is deposited.

A principal requirement of the base electrode 16, according to embodiments of the invention, is that it be compatible with the formation of the desired crystalline structure of the thin film ferroelectric ceramic 20, namely, the Perovskite structure. This results in a film 20 capable of exhibiting the desired piezoelectric or pyroelectric properties so that it will function in the manner intended. It has been found that for the base electrode 16 the preferred material is platinum. Platinum is compatible with, and results in, formation of the desired crystalline structure of the ferroelectric thin film 20 exhibiting the desired high piezoelectric properties. The top or second electrode 18 can include a variety of conductive metals commonly used as electrodes such as gold, silver, platinum, copper and the like. The preferred material for the top or second electrode 18 is gold. The preferred upper or top electrode 18 for the case of pyroelectric detector 50 is nickel chromium.

An important step in the method of producing the microsensor, microactuator or micromechanical device of the present invention includes the formation of the thin ferroelectric ceramic 20 on the base electrode 16. One technique for forming such a film is a technique known as sputtering. In general, sputtering involves the application of a thin film material by applying a high electric field between a solid target material and a grounded substrate onto which the film is to be formed. As a result of the electric field, particles are caused to fall from the target material to the substrate, thereby creating the thin film. A limitation of using a sputtering deposition technique to create ferroelectric ceramic thin films, however, is the extreme difficulty in getting the right composition in the thin film layer. When dealing with PZT, the specific formulation, and more particularly, the ratio of zirconate to titanate will determine the piezoelectric properties of the film. Thus, if it is desired to alter the zirconate to titanate ratio of the film when using sputtering deposition, a new target material with a new formulation must be prepared. This is a demanding task. Producing the desired composition of the PZT film is further complicated by the fact that the composition of the PZT film formed on the substrate is not necessarily identical to the composition of the target material and is often not uniform over the deposited area. Further, formation of thin film PZT by sputtering is not particularly good at withstanding certain chemical etching processes after the thin film has been performed.

In general, the transport deposition techniques are based on transporting, in a gaseous phase, the desired ferroelectric ceramic materials 20 over a heated wafer 12 surface. As a result of condensation of the vapor materials, a thin film of the desired ferroelectric ceramic material 20 is deposited. A limitation of using vapor phase transport of gases to create the ferroelectric thin film however, is the extreme toxicity of many of the materials needed to form the gaseous transport materials. The toxicity associated with these gases often requires excessive safety measures, expensive alarm monitoring systems and additional expense.

The preferred method for forming the thin film, ferroelectric ceramic in accordance with the present invention is the use of sol-gel deposition technologies. Sol-gel deposition techniques generally involve preparation of a chemical solution and application of such chemical solution to the substrate or surface either by dipping or by spin-coating. With a spin-coating technique, the solution is dispensed and the substrate is spun at a rate of between 1000 to 4000 revolutions per minute. This results in the formation of a thin film or coating over the entire surface of the substrate. Using sol-gel spin-coating techniques, coatings of about 0.1 micrometers in thickness can be applied. Further details regarding sol-gel deposition technology are available in the prior art.

One advantage of using sol-gel deposition techniques is the ability to better control the composition of the thin film 20 being deposited. As well as allowing for the easy additional incorporation of imparity dopants such as lanthanum and neodymium. For example, if a different film composition is desired, such difference can be accomplished merely by altering the chemical solution of the liquid which is dispensed onto the spinning substrate. This is particularly advantageous in enabling the film compositions to be altered so as to optimize their characteristics for specific sensor and actuator applications. Still further, sol-gel techniques allow for more efficient experimentation with film composition to obtain optimum properties. The thickness of the film formed using sol-gel techniques is dependent on a number of factors, including, among others, the makeup of the solution which is being deposited and the speed at which the substrate is rotated. Preferably, application of sol-gel deposition techniques in accordance with the present invention will deposit a film of approximately 0.1 micrometers or less in thickness. Thus, if thicker films are desired, the sol-gel process is repeated as many times as is necessary to achieve the desired thickness.

An existing problem in the formation of thin film ferroelectric ceramic 20 compositions is the tendency of the film to crack when stressed. This problem becomes greater as the film 20 becomes thicker. The problem also becomes greater as the stresses to which the film 20 are subjected during use become greater. In accordance with the present invention, the problem is overcome by sequential deposition and curing of a plurality of PZT layers. Preferably individual layers of ferroelectric ceramic are applied by spin coating at a thickness no greater than 0.2 micrometers and most preferably at a thickness no greater than 0.1 micrometers. Following each deposition, the ferroelectric ceramic is cured at its appropriate temperature. For PZT this is approximately 400° C. for 20 minutes. While the time and temperature may vary, they must be sufficient to drive off organic solvents of the ferroelectric ceramic solutions and crystallize the ferroelectric material to the proper phase. Following the deposition of layers with total thickness of about 0.2 micrometers, the ferroelectric ceramic is cured at a temperature greater than 550° C. and preferably about 650° C. for 20 minutes to form the desired Perovskite crystalline structure in the ferroelectric ceramic. The temperature of about 650° C. for PZT is necessary for this crystalline structure to form. Alternatively, each cure following each deposit can be cured at a temperature greater than 550° C. and preferably at 650° C. It has been found that the above sequential deposit and cured steps minimize PZT cracking and adhesion problems.

It is contemplated that the production of the microsensors, microactuators and micromechanical devices in accordance with the present invention will use integrated circuit processing and production techniques. In general, integrated circuit processing and production techniques involve sequentially depositing or forming various layers or portions of layers onto a semiconductor substrate such as a silicon wafer or die 12. These layers or portions of layers are generally formed by a series of material depositions followed by selective removal or patterning of certain portions of the deposition by photolithograph and etching. The details of incorporation of integrated circuit processing techniques with the use of thin film ceramic materials in the production of microsensors, microactuators and micromechanical devices according to the present invention can be understood best with reference to FIGS. 4A–4P.

FIG. 4 comprises a series of figures (A–P) illustrating the sequential fabrication of a micromechanical actuator (deflector) for fluid control applications. This structure generically demonstrates similar fabrication steps involved in making the other microsensor, microactuator, and micromechanical devices previously discussed. In FIGS. 4A–4P the same components have been given the same reference numerals as used in FIGS. 1, 2, and 3. Referring to FIG. 4A, generally, the process includes first providing a substrate 12 onto which the various structural components of the sensor, actuator, and micromechanical device are to be formed. This substrate 12 can be constructed of insulating materials such as quartz or sapphire, but preferably is constructed of a semiconductor such as silicon which is economical and easy to work with. In the preferred embodiment, the substrate 12 is a round silicon wafer of the type commonly used in the production of integrated circuit dies having a thickness of between 0.2 and 0.8 mm and surface diameter between about 2 mm and 20 mm thus having a usable surface area of between about 3 and 300 square mm.

Figure 4A:
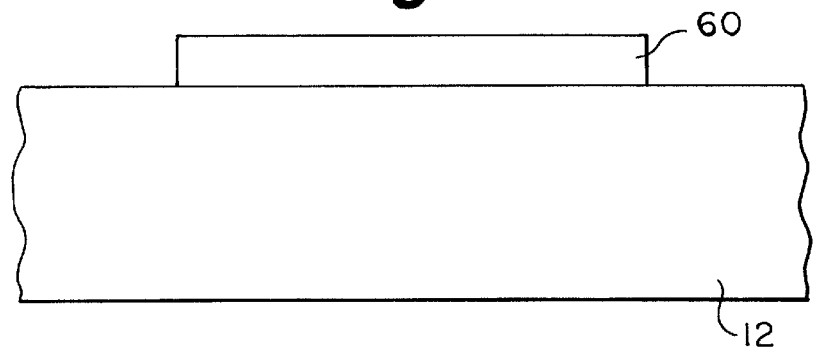
FIGS. 4a–4p represent sequential steps in the production of a surface-micromechanical actuator and sensor made in accordance with the present invention.
Figure 4B:
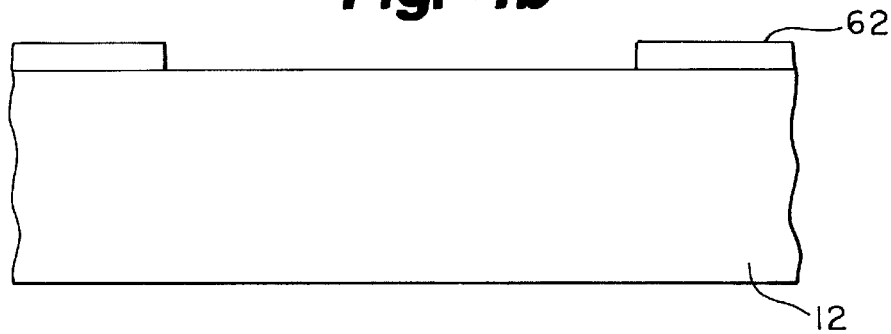

As shown in FIG. 4A, the substrate 12 is first cleaned and its surface is covered with a layer of photoresist 60 and selectively patterned. An aluminum 62 protection masking material is then deposited on the wafer and selectively lifted off in the wafer area covered by photoresist as shown in FIG. 4B.

Figure 4C:
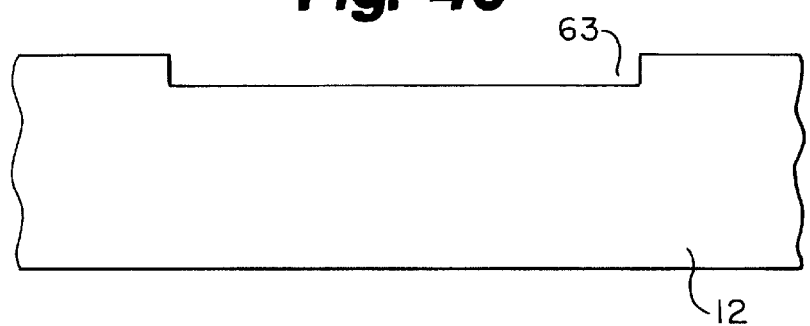

Next, as shown in FIG. 4C, the silicon wafer is selectively etched in a $CF_4/O_2$ plasma to a depth of 0.5 micrometers in the preferred embodiment. The protective aluminum layer is then removed by a standard commercial aluminum stripping solution.

Figure 4D:
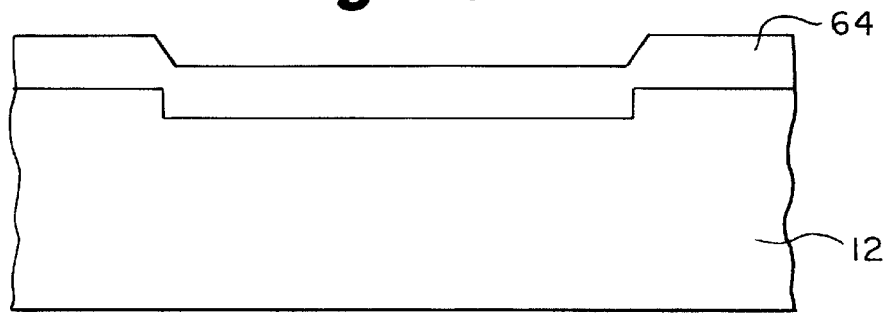

As shown in FIG. 4C, the wafer contains trenches 63, which eventually form air gaps, channels, and passage ways in the devices claimed, including sealed space 36. A blanket deposition of silicon dioxide glass 64 is then performed as shown in FIG. 4D by low-pressure chemical vapor deposition (LPCVD). In the preferred embodiment, the silicon dioxide glass is deposited to a thickness of 1.5 to 3.5 micrometers, the first 0.15 micrometers of which is an undoped oxide followed by the additional deposition of a silicon oxide with in situ phosphorous doping. This later type of silicon dioxide is well known in the integrated circuit processing industry and is commonly referred to a phosphosilicate glass, or simply PSG. The intentional doping with phosphorus in this application allows for both rapid and controlled removal of the silicon dioxide by lateral chemical etching.

Figure 4E:
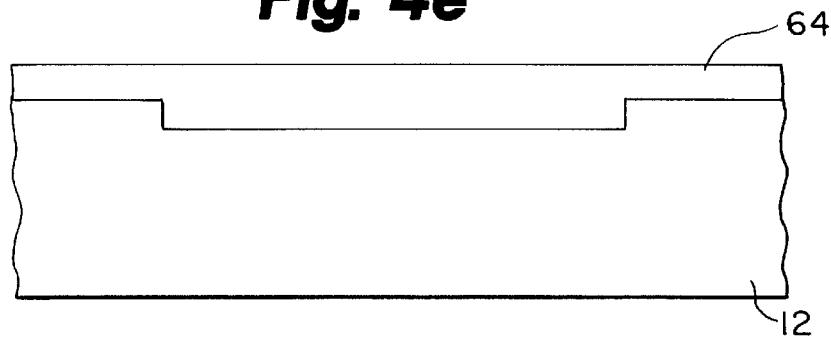

Next, as shown in FIG. 4E, the PSG 64 is densified and reflowed by thermal processing in a wet oxygen ambient at 950° C. for 15 minutes. This planarizes or flattens the topographical variation over the surface of the wafer.

Figure 4F:
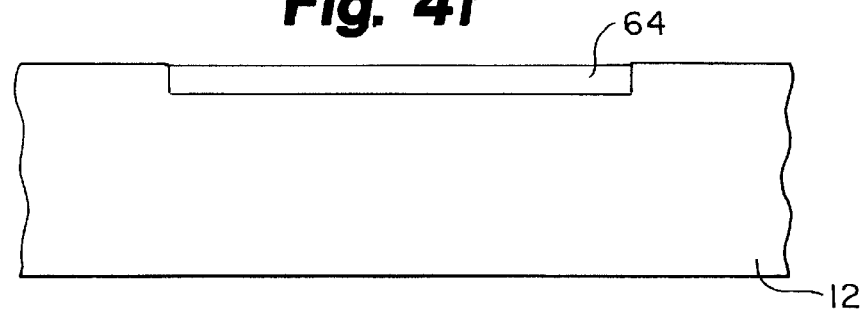

Next, the PSG 64 is patterned by conventional photoresist-photolithography and selectively etched (commonly referred to as an etchback technique) using a sequential combination of $CF_4/O_2$ and buffered hydrofluoric acid BHF, both etchants being commonly used in the manufacture of silicon integrated circuits. A relatively flat surface is thereby reestablished by this process as shown in FIG. 4F.

Figure 4G:
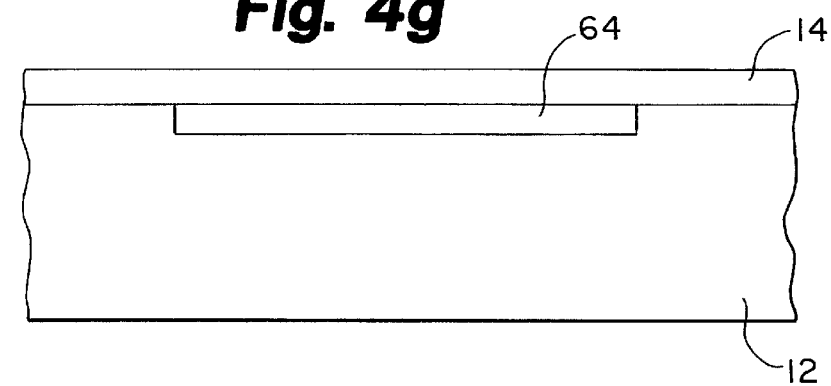

Next, as shown in FIG. 4G, a layer of silicon nitride 14 is deposited by low-pressure chemical vapor deposition to a thickness of approximately 0.5 to 3.0 micrometers. In the preferred embodiment the silicon nitride film thickness is selected to be 2.0 micrometers to have good structural integrity.

In microsensor, microactuator, and micromechanical device applications involving ferroelectric thin films, lower electrode 16 adhesion to the silicon nitride membrane 14 has often been difficult to achieve. The additional deposition of an undoped layer of polycrystalline silicon with a thickness of approximately 0.25 micrometers may optionally be used as an adhesion covering for the silicon nitride structural membrane 14.

Figure 4H:
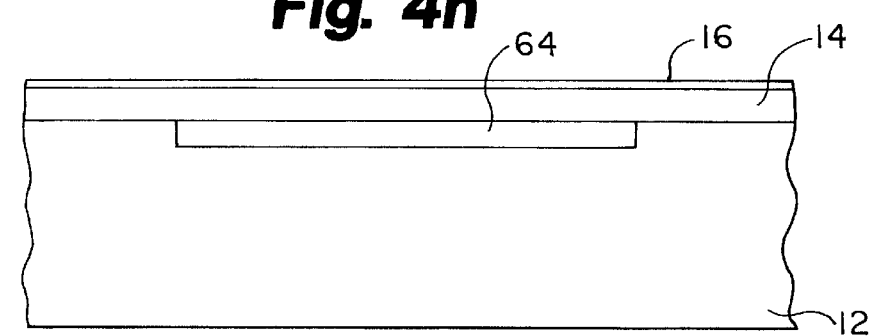

Next, the lower electrode 16 for the microsensor and microactuator structures is formed as shown in FIG. 4H. Several different materials may be used for this base electrode, but the choice is restricted by the particular ferroelectric crystalline properties desired, requirement of having a chemically stable base electrode surface, and requirement of good adhesion and low stress. The lower electrode is formed in the preferred embodiment by the sequential sputtering of titanium and platinum. The titanium thickness is 0.05 micrometers and the platinum thickness is 0.25 micrometers. It is commonly recognized that the titanium promotes good adhesion of the underlying surface to platinum and that platinum represents a common electrode surface upon which oriented Perovskite ceramic thin films can be prepared.

Next, a thin film layer of ferroelectric ceramic 20 is deposited over the entire surface of the substrate as shown in FIG. 4I. In the preferred embodiment, the ferroelectric material selected is PZT and is deposited using sol-gel techniques to a thickness between 0.1 to 10 micrometers with a preferable thickness of approximately 0.35 micrometers. To achieve this thickness, several sol-gel deposition steps are performed. Between deposition steps, the PZT is cured to drive off organic components in the manner previously described.

Following deposition of the thin film ferroelectric layer 20, an upper electrode 18 is formed by sputtering titanium and platinum in approximately the same thicknesses as used for the lower electrode 16 as shown in FIG. 4J. The upper electrode 18 is then patterned using photolithography techniques.

The titanium and platinum (Ti/Pt) layers are etched by ion beam milling to form the desired top electrode patterns as shown in FIG. 4K.

Next, as shown in FIG. 4L, the exposed ferroelectric ceramic 20 is then etched, if needed, by the either dry or wet chemical etching techniques. In the preferred embodiment, a solution of $H_2O:HCl:HF$ in a ratio of 10:10:1 is used to etch PZT 20.

An additional photolithography step is then applied and the unprotected regions of the lower electrode 16 are etched by ion beam milling techniques as shown in FIG. 4M.

The final patterning of the silicon nitride structural support is then formed by photolithography and selective dry etching as shown in FIG. 4N. Here standard $CF_4/O_2$ drying etching is used exposing the underlying PSG layer.

Before the final chemical undercutting of the structural membrane and depending on the device application, additional electrical interconnection metals 66 and inter-level dielectric materials may be selectively deposited and patterned. This is particularly important if the starting wafer contained encapsulated integrated circuits already fabricated to the point of electrical contact openings. On-chip transistors are not shown in the simple representative structures described in FIGS. 1, 2, and 3, but could have been already present on the wafer at the starting point depicted in FIG. 4A. If these integrated circuits have already been formed, then at least one additional aluminum interconnection electrode 66 and possible silicon dioxide passivation layers would need to be deposited at this point. The formation of inter-level dielectrics and final aluminum metalization is well known and understood in the manufacture of integrated circuits.

Final undercutting of the PSG 64 is then performed. A thick photoresist is used in protecting the two electrodes 16 and 18 surrounding the ferroelectric thin film 20 as well as the ferroelectric thin film itself. Additional protection to the subsequent chemical undercutting of the PSG 64 may be required. The use of plasma deposited amorphous materials 68 may be used as needed depending on the length of time with which the photoresist must selectively withstand the imposed chemical etching environment. In the extreme cases, not necessarily representative of the simple embodiments shown in FIGS. 1, 2, and 3, an additional amorphous layer of plasma-deposited silicon nitride or other protective material 66 is used to conformally coat the exposed edges of the electrodes 16 and 18 and ferroelectric thin film ceramic 20 as shown in FIG. 4O. The final step involves the chemical undercutting of the silicon nitride membrane wherein the PSG layer is completely etched by hydrofluoric acid or buffered hydrofluoric acid (BHF). Upon completion of this etching step a free standing composite beam is formed as shown in FIGS. 4P and 1 and for the suspended diaphragm shown in FIGS. 2 and 3.

A critical issue involved in the fabrication of the micromechanical structures described in this patent is the structural integrity of the free standing composite material membranes and diaphragms. In order to avoid mechanical shock to these structures as commonly encountered in ordinary integrated circuit chemical rinsing and drying steps, final undercutting, or freeing, of the micromechanical structures is done as one of the final processing steps. Because the beams and diaphragms formed are suspended, application of a voltage between electrodes 16 and 18 induces a stress across the ceramic material 20. This stress produces a deflection in the freely suspended region of the micromechanical structure, the upward or downward movement being determined by the polarity of the applied voltage. This stress can further be converted into a force to be transduced to an object not fabricated as part of the structure described. Conversely, for the operation as an infrared detector 50, a voltmeter is connected between the upper and lower electrodes and a voltage signal is read out proportional to the average temperature increase seen by the ferroelectric ceramic thin film 20. The low thermal conductance of the silicon nitride structural support 14 prevents the unwanted heat loss of the incident warm object from being lost to the substrate 12.

For the microdevice 100 of a further embodiment of the present invention, the PZT solution was made by a MOD method. Lead acetate, titanium isopropoxide, and zirconium n-propoxide were used as a starting materials. The PZT(53/47) thin film is deposited by the MOD method on Pt/Ti/SiO$_2$/Si-wafer substrate and has 821 in relative dielectric constant. Also, the PZT(53/47) thin film shows 38 $\mu$C/cm$^2$ and 52 kV/cm in remanent polarization and coercive field, respectively. In MEMS processing, many devices have sacrificial layers such as PSG or silicon oxide and require silicon nitride or polysilicon as the structure materials for the devices. In the process of the present invention, silicon nitride is used instead of the conventional silicon oxide for the PZT substrate because the silicon oxide would be etched by the HF when the PSG sacrificial layer in etched. Also, the use of a polysilicon layer between the Pt/Ti/TiO$_2$ electrode layer and the silicon nitride layer is needed to increase the adhesion between the electrode layer and the silicon nitride layer.

Figure 25:
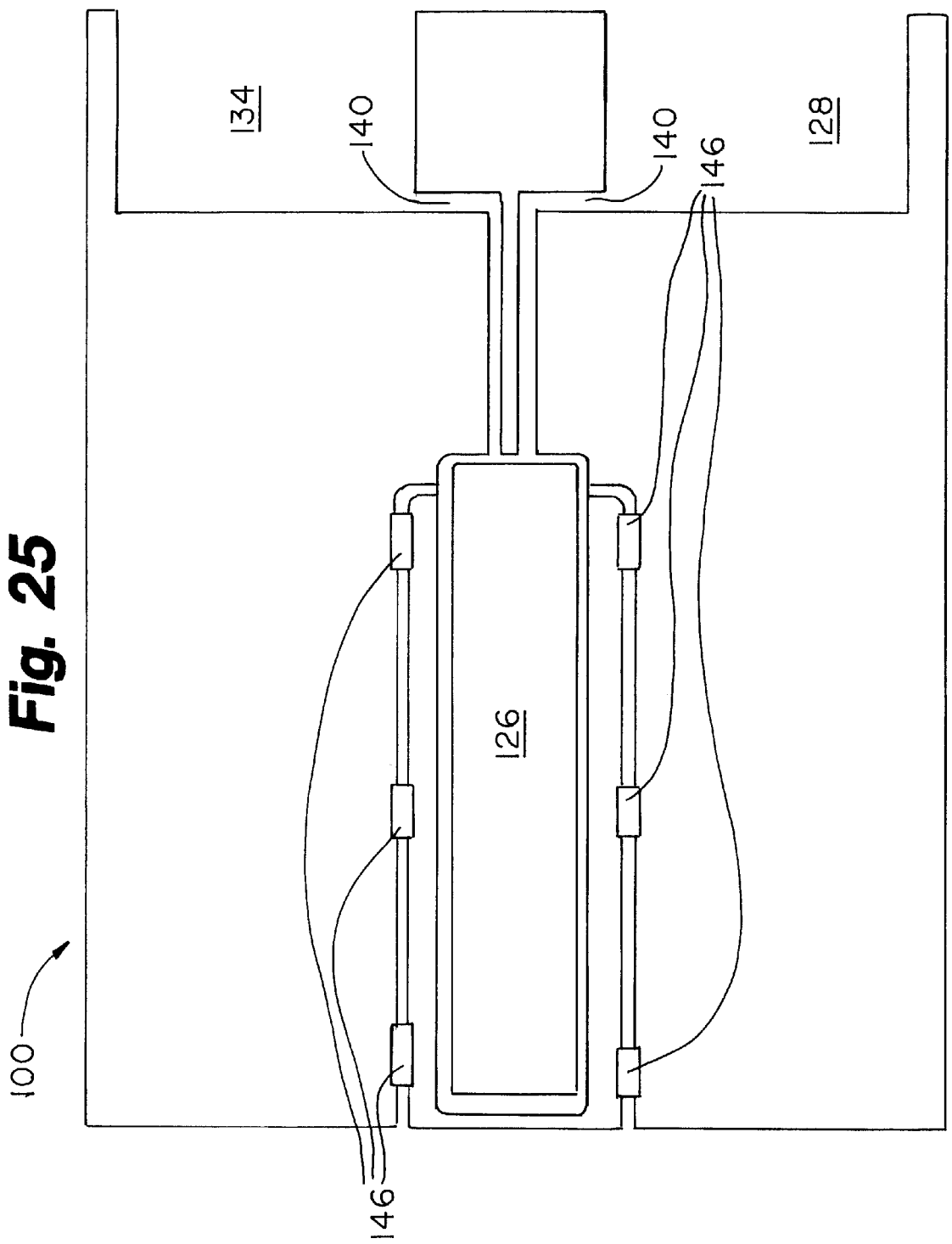
FIG. 25 is a photographic image of the microdevice after 5 minutes in HF vapor for etching PSG with double layer of photoresist and PECVD silicon nitride as the encapsulation layer.

The deposition temperature of the silicon nitride and polysilicon layers was 800° C. and 600° C., respectively, and the sintering temperature of the PZT was 700° C. Therefore, the substrate did not have good temperature stability in comparison with the silicon oxide substrate as a PZT substrate. As shown in FIG. 25, it was found that post annealing of the polysilicon/silicon nitride/silicon-wafer substrate was very important in order to increase the quality of the PZT thin films which was deposited on Pt/Ti/TiO$_2$/polysilicon/silicon nitride/silicon-wafer structure substrate. In the X-ray diffraction results, it was found the platinum silicide peaks on the substrate which was not post annealed after a 700° C./30 minute heat treatment.

The objective of the encapsulation layer is to protect the other material areas from the HF vapor used for etching the PSG sacrificial layers. HF vapor can very easily etch the PZT, Ti, and TiO$_2$ layers as well as PSG layer. The etch rate of the PSG through the bores 146 was 30 $\mu$m/minute. To protect the other areas from the HF vapor, PECVD silicon nitride, chromium, and photoresist layers were used for the encapsulation. To reduce the opened interface area with the HF vapor, the bores 146 were patterned for etching PSG instead of using long trenches. This method increases the time for etching PSG, but it also reduces the opened interface area so that the HF vapor can not easily etch PZT or the Ti layers through the interface. To prevent the HF vapor from attacking through the bores 146 or defects of the LPCVD silicon nitride layer, a double layer photoresist after PECVD silicon nitride deposition is preferably used. FIG. 25 shows the microdevice 100 after 5 minutes in vapor HF for etching PSG with double layer of photoresist and PECVD silicon nitride as the encapsulation layer. The microdevice 100 device was not attacked by the HF vapor. Specific details of the fabrication process of the microdevice 100 are presented below.

The microdevice of the present invention is shown generally at 100 in FIGS. 5a–24b. Referring to FIGS. 5a–5c, the microdevice 100 has a silicon (Si) substrate 102. A trench 104 in a trench area is defined in the silicon substrate 102. To form the trench 104, the silicone substrate 102 is cleaned, preferably by the RCA method. A silicon dioxide (SiO$_2$) layer is then deposited on the upper surface of the substrate 102, preferably by the wet thermal oxidation method. The thickness of the silicon dioxide layer is preferably from 10 to 200 nanometers. Optimal thickness of the silicon dioxide layer is approximately 80 nanometers. A photoresist layer (not shown) is then applied over the silicon dioxide layer. The photoresist is patterned by conventional photoresist-photolithography to define the edge of the trench 104. The photoresist is removed and the silicon dioxide is then etched by buffered oxide etchant (BOE). The BOE does not etch the silicon substrate 102. The silicon substrate 102 is then etched by plasma reactive ion etching (RIE) to define the trench 104 in a trench area. Preferably, the trench 104 is etched utilizing CF$_4$O$_2$ gases. The etching depth of the trench 104 is from 200 to 3,000 nanometers with the optimal depth being about 900 nanometers.

After etching the trench 104 into the silicon substrate 102, the remaining photoresist that is peripheral to the trench 104 is removed by acetone, methanol, isopropanol, and D.I. water. The peripheral silicon dioxide is then moved by BOE solution.

After performance of the foregoing steps, the microdevice is substantially as appears in FIGS. 5a–5c.

Referring to FIGS. 6a–6c, a layer of phosphosilicate glass (PSG) 106 is deposited as a sacrificial layer on the upper surface of the microdevice 100 as depicted in FIGS. 5a–5c. The PSG 106 is preferably deposited by low pressure chemical vapor deposition (LPCVD). The layer of PSG 106 is preferably formed to a depth that is from 1,000 to 4,000 nanometers. It is important that the depth of the layer of PSG 106 is greater than the depth of the trench 104. Accordingly, the upper surface of the PSG 106 lying in the trench 104 is at a height greater than the upper surface of the silicon substrate 102 that is peripheral to trench 104.

Preferably, the microdevice is annealed at 950° C. for fifteen minutes in a wet oxygen ambient atmosphere. The annealing is to enhance the densification and reflow of the PSG 106 layer.

Alternatively, polycrystalline silicon may be used for the sacrificial layer in place of the aforementioned PSG 106. Polycrystalline silicon may be etched by KOH. The use of polycrystalline silicon as the sacrificial layer then permits the use of a silicon dioxide layer as a structural material. This is possible due to the high etching selectivity with polycrystalline silicon in KOH.

Referring to FIGS. 7a–7c, a layer of photoresist 108 is deposited over the entire upper surface of the microdevice 100. Photoresist 108 is utilized to planarize the upper surface of the silicon substrate 102 and the PSG 106 formed in the trench 104. The layer of photoresist 108 is depicted in FIGS. 7a and 7c. The planarization process is preferably a two step etching process. Initially, the photoresist 108 that is formed peripheral to the trench 104 is developed and removed. The PSG 106 that has been initially uncovered by removal of the photoresist 108 is depicted as dashed lines. This portion of the PSG 106 is then removed by BOE.

The second step is to remove the photoresist 108 that overlies the trench 104 and is indicated in the Figures as having a spiked rim. Once this photoresist 108 has been moved, the upper surface of the PSG 106 that overlies the trench 104 is exposed. This surface of the PSG 106 is carefully etched by BOE to achieve an upper surface of the PSG 106 that is flush with the upper surface of the silicon substrate 102. This surface is indicated by the dashed line 110 in FIG. 7c.

After completion of the foregoing steps, the microdevice 100 has a planar upper surface comprised of a periphery of silicon substrate 102 surrounding the trench 104 having the PSG 106 formed therein as depicted in FIG. 7b.

In FIGS. 8a–8c, a layer of silicon rich nitride 110 is formed on top of the microdevice 100 as depicted in FIG. 7b. The silicon rich nitride 110 can be represented by the symbol Si$_{3+x}$N$_4$. The low stress silicon nitride 110 is preferably deposited by the low pressure chemical vapor deposition (LPCVD) method using dichlorosilane (DCS) and ammonia gas. During the deposition of the silicon nitride 110, the ratio of the gas flow is preferably $SiCl_2H_2:NH_3=5:1$. The thickness of the silicon nitride 110 is preferably from 500 to 5,000 nanometers with an optimum thickness of about 1,500 nanometers.

The next step in the process of forming the microdevice 100 is to deposit a layer of polycrystalline silicon 112 on top of the silicon nitride 110 as depicted in FIGS. 9a–9c. The layer of polycrystalline silicon 112 is preferably deposited by the LPCVD method. The thickness of the polycrystalline silicon is preferably from 50 to 1,000 nanometers and is preferably about 200 nanometers thick. The polycrystalline silicon 112 is utilized to increase the adhesion between the silicon nitride 110 and a platinum bottom electrode layer to be applied later in the process. The polycrystalline silicon 112 is a silicon based layer and accordingly exhibits good adhesion with the layer of silicon nitride 110 on which the polycrystalline silicon 112 is deposited. Importantly, the microdevice 100 is post annealed after deposition of the polycrystalline silicon 112. The post annealing takes between 600 and 1,200° C. for between 5 and 180 minutes. The post annealing occurs in a nitrogen atmosphere. Preferably, the post annealing is performed at 950° C. for 30 minutes.

FIGS. 10a–10c depict the deposition of three layers on top of the polycrystalline silicon 112 depicted in FIGS. 9a–9c. The first two layers are very thin and are comprised of titanium oxide ($TiO_2$) 114 and titanium (Ti) 116. Both the titanium oxide 114 and titanium 116 are deposited preferably by the sputtering method. The thickness of the titanium oxide 114 is preferably from 10 nanometers to 200 nanometers and the thickness of the titanium 116 is preferably from 10 nanometers to 300 nanometers. The titanium oxide 114 is deposited in order to increase the adhesion between the polycrystalline silicon 112 and the titanium 116. The polycrystalline silicon 112 has many small grains that increase the adhesion with the titanium oxide 114. The titanium oxide 114 and the titanium 116 are both titanium based and accordingly have good mutual adhesion. The titanium 116 acts as a buffer layer and demonstrates good adhesion with the later applied platinum (Pt) 118 that forms the bottom electrode.

The platinum 118 is preferably applied to the titanium 116 by the sputtering method. The platinum 118 is deposited in a thickness ranging from 50 nanometers to 1,000 nanometers and is preferably a thickness of 170 nanometers.

Alternatively, the bottom electrode for the PZT thin film may be ruthenium (Ru), ruthenium oxide ($RuO_2$)/ruthenium, platinum/ruthenium oxide/ruthenium, and platinum/ruthenium. The ruthenium has very good adhesion with the silicon nitride 138. The ruthenium (Ru), ruthenium oxide ($RuO_2$) demonstrate very good ferroelectric characteristics. To minimize the hysteresis effects of the ruthenium compounds, a platinum electrode may be deposited on the Ru, $RuO_2$, and $Ru/RuO_2$ hybrid layers. Use of such hybrid layers negates the need for the aforementioned polycrystalline silicon 112, titanium oxide ($TiO_2$) 114, and titanium (Ti) 116 layers to enhance adhesion.

Turning to FIGS. 11a–11c, a piezoelectric ceramic film 120 is deposited on top of the platinum 118 and forms the lower electrode. The piezoelectric ceramic (PZT) 120 may be deposited on the platinum 118 by metalorganic decomposition (MOD), sol-gel, sputtering, and chemical vapor deposition (CVD) methods, as desired. The thickness of the PZT 120 is from 100 to 5,000 nanometers. In the case of solution deposition methods, such as MOD and sol-gel, the solution of PZT 120 is spun on the whole upper surface of the microdevice 100 and dried first at 110° C. for 10 minutes for removing soluble components of the solvent and then at 400° C. for 10 minutes for removing organic components in the solvent. A thicker film of PZT 120 may be achieved by repeating the foregoing process. After achieving the desired thickness, the PZT 120 is sintered at 500–800° C. for 5–120 minutes.

Referring to FIGS. 12a–12c, a layer of platinum 122 is deposited on the microdevice 100 to form the top electrode of the PZT 120. To increase the adhesion between layers, a layer of titanium 124 may optionally be deposited between the PZT 120 and platinum 122. The layer of titanium 124 is evident in FIG. 12a and was not utilized in FIG. 12c. When used, the layer of titanium 124 has a thickness of between 50 and 500 nanometers. The platinum 122 has a thickness from 50 to 500 nanometers. The preferred thickness of the titanium 124 is 70 nanometers and the preferred thickness of the platinum 122 is about 170 nanometers.

Figure 13A:
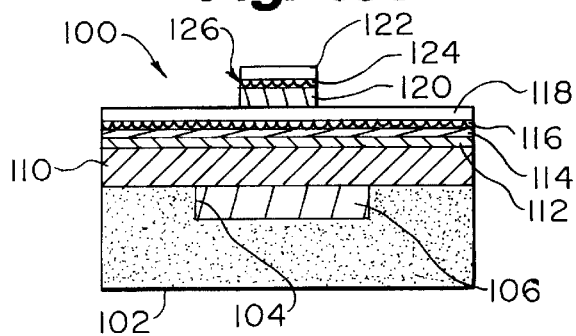
FIG. 13a is an end sectional view depicting the results of a milling operation to form a portion of the beam structure with the section extending through the trench portion thereof.
Figure 13B:
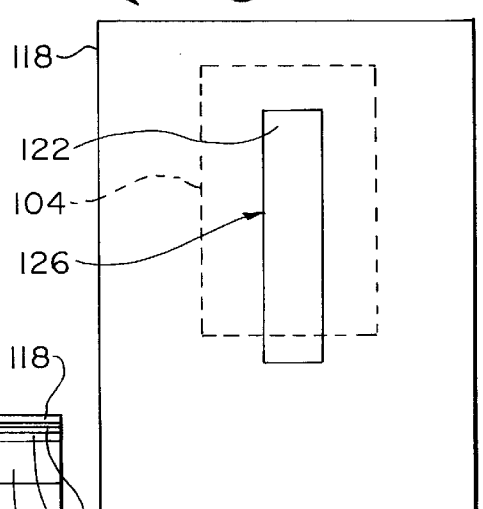
FIG. 13b is a top plan form view of the device depicting the beam structure overlying the trench depicted in phantom.
Figure 13C:
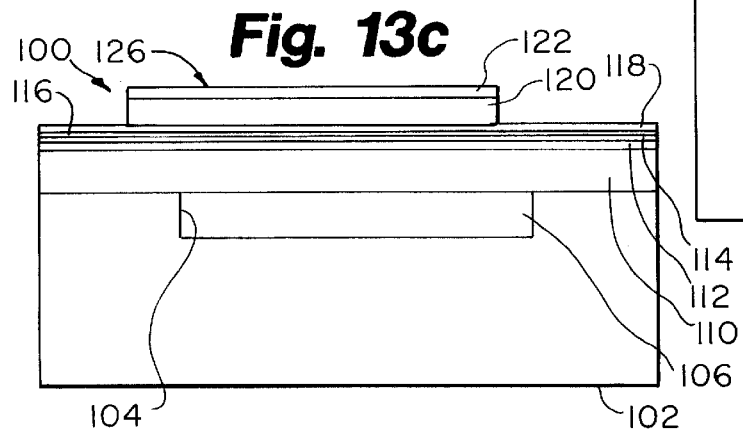
FIG. 13c is a side sectional view of the device of FIG. 13b with the section extending through the trench portion of the device and the beam of the device.

The operation of FIGS. 13a–13c comprises the first milling operations that define the deflectable component, the beam 126, of the microdevice 100. The deflectable component 126 of the microdevice 100 is a sensor/actuator. Deflecting the deflectable component 126 with an external force generates a voltage representative of such force. Imparting a voltage to the deflectable component 126 causes the deflectable component 126 to deflect predictably, comprising an actuator. The milling performed in this operation is performed conventionally by photoresist-photolithography. The PZT 120, platinum 122, and titanium 124 (when used) that is formed peripheral to the beam 126 is milled away preferably by an ion milling process.

Figure 14A:
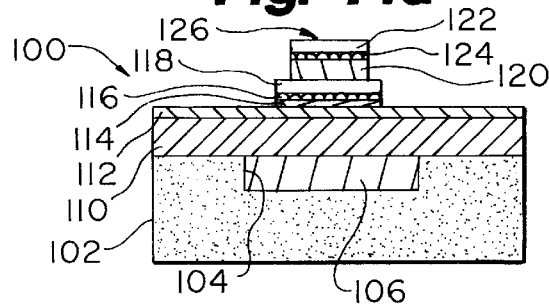
FIG. 14a is an end sectional view of the device with the bottom electrode of the beam formed as the result of a milling operation with the section extending through both the trench portion and the beam thereof.
Figure 14B:
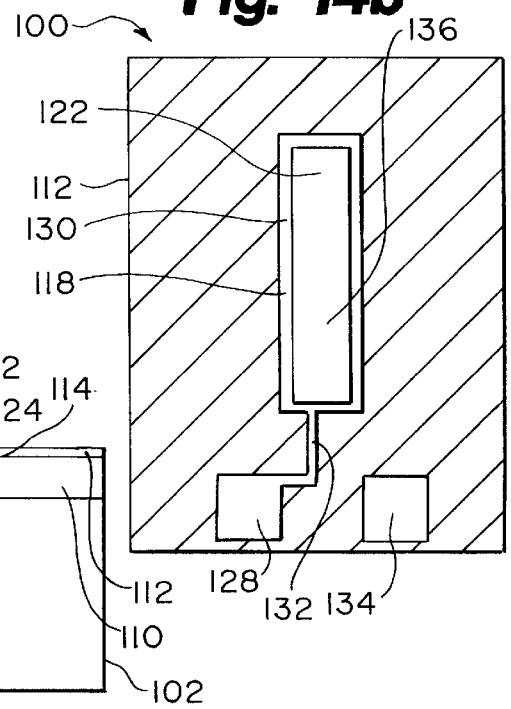
FIG. 14b is a top plan form view of the device.
Figure 14C:
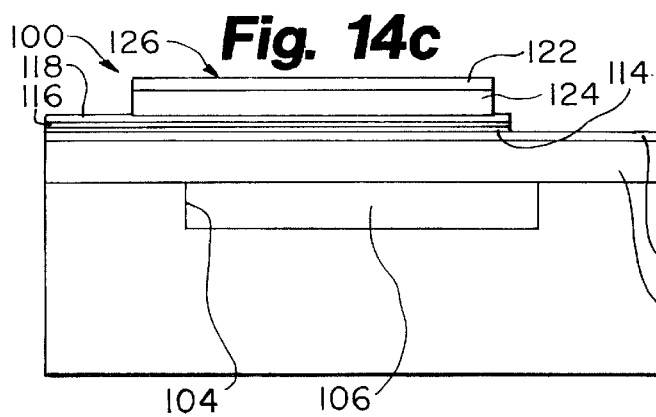
FIG. 14c is a side sectional view of the device of FIG. 14b with the section extending through both the trench and beam portions of the device.

A successive ion milling process is performed in the operation performed in FIGS. 14a–14c. In this operation, the bottom electrode, comprised of platinum 118, and the titanium 116 and titanium oxide 114 layers that underlie platinum 118 are etched to form the bottom electrode. The microdevice 110 is patterned by photoresist-photolithography and the platinum 118 that is formed peripheral to the beam 126 is etched by ion milling process. This etching defines the bottom electrode pad 128 that is an electrical connection to the bottom electrode 130 by electrical pad 132. The top electrode pad 134 is also formed but is not electrically connected to the top electrode 136 at this stage of the fabrication process.

Figure 15A:
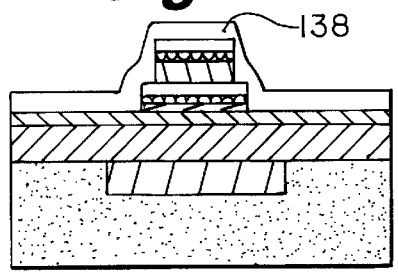
FIG. 15a is an end sectional view of the device depicting a layer of silicon nitride deposited on the top surface and beam thereof with the section extending through the trench and beam portions.
Figure 15B:
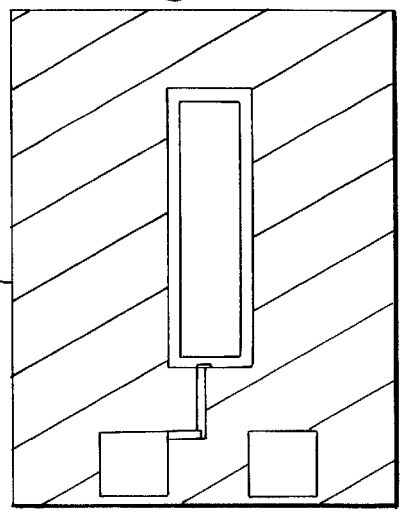
FIG. 15b is a top plan view depicting the silicon nitride layer overlying the platinum electrodes depicted in FIG. 14b.
Figure 15C:
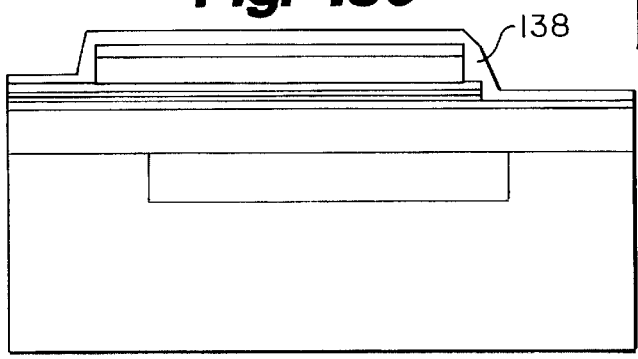
FIG. 15c is a side sectional view of the device of FIG. 15b with the section extending through the trench and beam portion thereof.

As depicted in FIGS. 15a–15c, a layer of silicon nitride 138 is deposited over the entire upper surface of the microdevice 100 as depicted in FIGS. 14a–14c. The silicon nitride 138 is deposited preferably by the plasma enhanced chemical vapor deposition (PECVD) method of deposition. The thickness of the silicon nitride 138 is from 15 nanometers to 1,000 nanometers and is preferably approximately 500 nanometers.

Figure 16A:
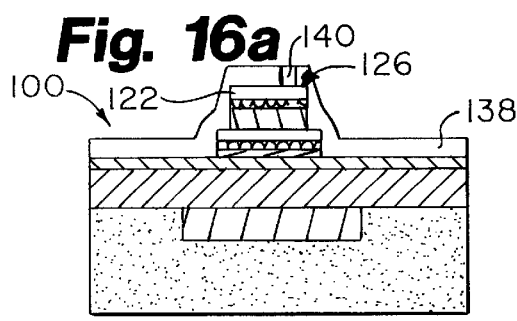
FIG. 16a is an end sectional view of the device with the silicon nitride etched for electrical connection between the top electrode and the pad.
Figure 16B:
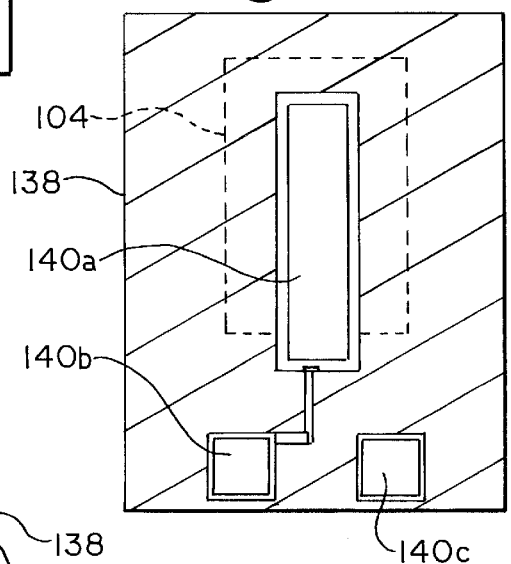
FIG. 16b is a top plan form view of the device.
Figure 16C:
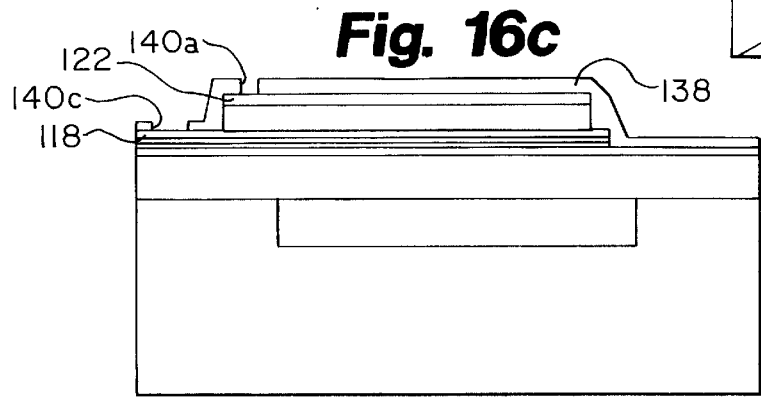
FIG. 16c is a side sectional view of the device of FIG. 16b.

Referring to FIGS. 16a–16c, a layer of photoresist (not shown) is deposited over the silicon nitride 138 and connector etchings 140a, 140b, and 140c are made to provide for electrical connection between the bottom electrode pad 128 and the bottom electrode 130 and between the top electrode 134 and the top electrode 136.

Figure 17A:
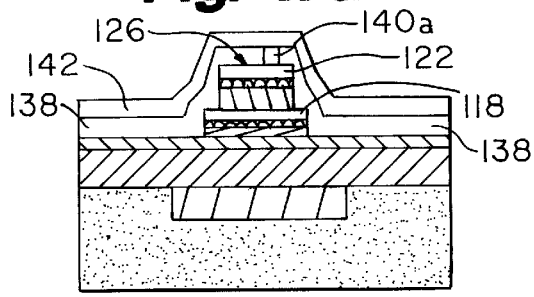
Figure 17B:
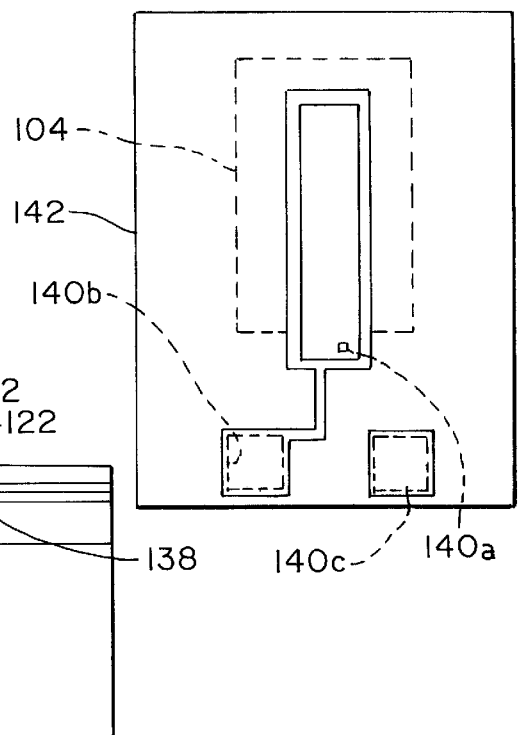
FIG. 17b is a top plan form view with the beam top electrode, electrode pads and trench depicted in phantom.
Figure 17C:
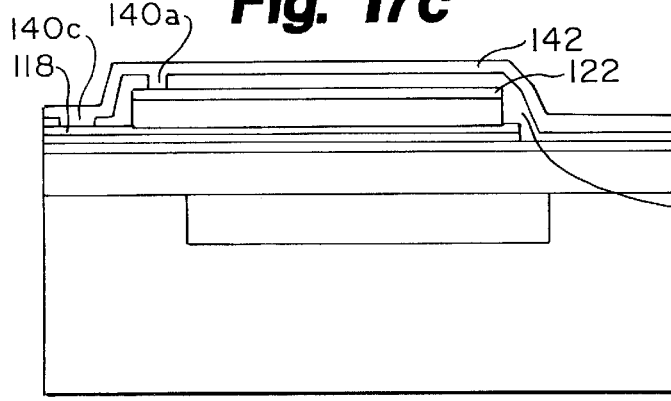
FIG. 17c is a side sectional view of the device of FIG. 17b.

In the operation of FIGS. 17a–17c, a layer of aluminum 142 is deposited over a layer of silicon nitride 138. The aluminum flows into the connector etchings 140a, 140b, and 140c to make physical contact with the platinum 118, 122 that comprises the bottom of the connector etchings 140a, 140b, and 140c. The aluminum 142 is preferably deposited by the e-beam method. Thickness of the aluminum 142 is from 100 nanometers to 1,000 nanometers with a preferred thickness of approximately 500 nanometers.

Figure 18A:
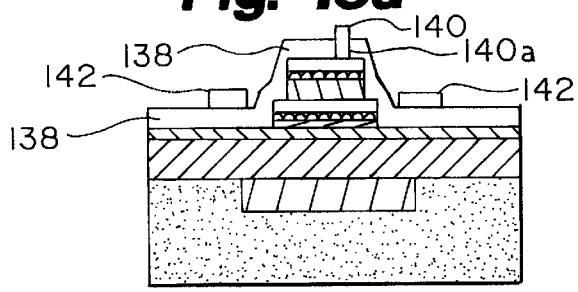
Figure 18B:
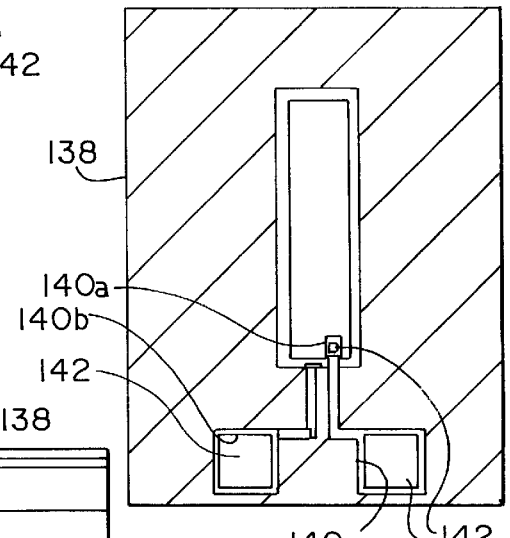
FIG. 18b is a top plan form view of the device.
Figure 18C:
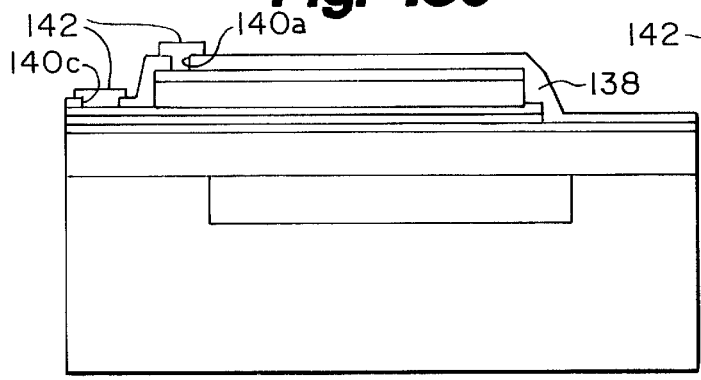
FIG. 18c is a side sectional view of the device of FIG. 18b.

Referring to FIGS. 18a–18c, the aluminum 142 is patterned by conventional photoresist-photolithography etched by aluminum etchant to remove the entire layer of aluminum 142 with the exception of that aluminum 142 that flowed into the connector etchings 140a, 140b, and 140c. The exposed silicon nitride 138 is then etched away as indicated in FIGS. 19a–19c, leaving only small portions of the silicon nitride 138 beneath the caps of the aluminum 142 as shown in FIG. 19c.

In the operation of FIGS. 20a–20c, an encapsulating layer 144 is deposited over the entire upper surface of the microdevice 100. The encapsulating layer 144 may be formed of materials such as PECVD silicon nitride, photoresist, palylene and polyamide. The thickness of the encapsulating layer 144 is from 300 to 8,000 nanometers. A preferred thickness of the encapsulating layer 144 when the encapsulating layer 144 is formed of PECVD silicon nitride or palylene is 1,000 nanometers. Most preferably, the encapsulating layer 144 is formed of palylene. Preferably, a double layer of photoresist is then deposited over the silicon nitride, palylene, or polyamide to complete the encapsulating layer 144.

In the operation depicted in FIGS. 21a–21c, four descending bores 146 are etched in the microdevice 100 extending to the PSG 106 formed in the trench 104. The four bores 146 are located proximate the four corners of the trench 104. Two additional bores 146 may be disposed proximate the mid point of the trench 104, as desired. Such bores 146 may be seen in the photo of FIG. 27. The bores 146 are formed by patterning by conventional photoresist-photolithography and then etched through the encapsulating layer 144, the polycrystalline silicon 112, and the low stress silicon nitride 110. The etching is preferably by the RIE method. The use of the bores 146 to expose the PSG 106 is advantageous for preventing attack to structures of the microdevice 100 other than the PSG 106 when PSG 106 is being etched as the surfaces of such structures that is exposed to the HF vapor is minimized. The bores 146 may be of a cross sectional size ranging from one micrometer and one centimeter squared, as desired for the size of the specific microdevice 100 being fabricated.

Etching of the PSG 106 in the trench area is as depicted in FIGS. 22a–22c. The etching of the PSG 106 is preferably performed by hydrofluoric acid (HF) vapor. The HF vapor etches both vertically and horizontally in the bores 146 to remove the PSG 106 from the trench 104.

Referring to FIGS. 23a–23c, the remainder of the encapsulating layer 144 is removed conventionally after the trench 104 has been opened up as depicted in FIGS. 22a–22c. The completely fabricated microdevice 100 of the present invention is depicted in FIGS. 24a, 24b.

FIG. 25 is a photographic image of the completely fabricated microdevice 100 after five minutes of exposure to the HF vapor for etching of the layer of PSG 106. The encapsulating layer 144 was a double layer of photoresist and PECVD silicon nitride. Use of the bores 146 demonstrated that the microdevice 100 was not attacked by the HF vapor.

Although the description of the preferred embodiment has been quite specific and most applicable to the formation of a cantilever sensor/actuator, various modifications can be made without deviating from the spirit of the present invention. Accordingly, it is intended that the scope of the present invention be dictated by the appended claims rather than by the description of the preferred embodiments.

I claim:

1. A microdevice comprising:

a device substrate having a trench area;

a deflectable component being mounted for deflection on the device substrate over the trench area, the deflectable component having a sensor/actuator, the sensor/actuator having a first top electrode and a second bottom electrode and a piezoelectric thin film disposed between said first and second electrodes, said thin film being PZT, the sensor/actuator being disposed on a sensor/actuator substrate, the device substrate and sensor/actuator substrate each being formed of a material selected for being resistive to attack by a selected etchant used for etching in the trench area; and a selectively removable encapsulation layer being deposited on selected portions of the microdevice to substantially isolate the selected portions of the microdevice from exposure to the selected etchant, wherein the selectively removable encapsulation layer can be removed from the selected portions of the microdevice.

2. The microdevice of claim 1 further including at least one adhesion enhancing layer disposed between the sensor/actuator second electrode and the sensor/actuator substrate.

3. The microdevice of claim 2 wherein the adhesion enhancing layer is formed of at least one material selected from a group consisting of:

polycrystalline silicon; and titanium oxide ($TiO_2$).

4. The microdevice of claim 1 wherein at least a portion of the deflectable component is disposed in relation to the trench area formed in the device substrate such that said trench area accommodates deflection of the deflectable component therein.

5. The microdevice of claim 4 wherein the deflectable component is a cantilever beam, the cantilever beam having a proximate end and a distal end, the proximate end being operably coupled to the device substrate.

6. The microdevice of claim 1 wherein the sensor/actuator substrate is formed of silicon nitride, the silicon nitride having been post annealed.

7. The microdevice of claim 6 wherein the silicon nitride sensor/actuator substrate is post annealed at 600 to 1200 degrees centigrade for 5 to 180 minutes.

8. The microdevice of claim 7 wherein the silicon nitride sensor/actuator substrate is post annealed at substantially 950 degrees centigrade for substantially 30 minutes.

9. The microdevice of claim 1 wherein the bottom electrode is formed from at least one material selected from a list of materials consisting of:

ruthenium(Ru);

ruthenium oxide ($RuO_2$);

platinum/ruthenium oxide ($RuO_2$); and platinum/ruthenium.

10. The microdevice of claim 9 wherein the encapsulation layer is formed from at least one material selected from a list of materials consisting of:

PECVD silicon nitride;

photoresist;

palylene; and polyamide.

11. The microdevice of claim 10 wherein the trench area is etched underlying at least a portion of the sensor/actuator.

12. The microdevice of claim 11 wherein a plurality of bores are defined in the encapsulation layer, said bores extending to a margin of the trench area.

13. The microdevice of claim 1 wherein the encapsulation layer is formed of a plurality of layers having a silicon nitride layer and at least one layer of photoresist.

* * * * *

UNITED STATES PATENT AND TRADEMARK OFFICE
CERTIFICATE OF CORRECTION

PATENT NO. : 5,914,507
DATED : June 22, 1999
INVENTOR(S) : Polla et al.

Page 1 of 2

It is certified that error appears in the above-identified patent and that said Letters Patent is hereby corrected as shown below:

Column 1, line 5, after "1996" insert --,--.

Column 2, line 53, after "heat" insert --,--.

Column 2, line 54, after "heat" delete ","

Column 3, line 32, after "deep" insert --trench--.

Column 3, line 59, after "After" delete "the".

Column 4, line 54, delete the second occurrence of "FIG. 6c" and insert --"FIG. 6b--.

Column 6, line 4, after "is" delete "a" and insert --an--.

Column 12, line 35, delete "are" and insert --is--.

Column 15, line 4, after "as" delete "a".

Column 15, line 29, after "In" delete "the".

Column 15, line 52, after "100" delete "device".

Column 15, line 59, delete "silicone" and insert --silicon--.

UNITED STATES PATENT AND TRADEMARK OFFICE
CERTIFICATE OF CORRECTION

PATENT NO. : 5,914,507
DATED : June 22, 1999
INVENTOR(S) : Polla et al.

It is certified that error appears in the above-identified patent and that said Letters Patent is hereby corrected as shown below:

Column 18, line 29, after "away" insert --,--.

Column 20, line 55, after "and" commence a new paragraph.

Signed and Sealed this

Twenty-fifth Day of April, 2000

Attest:

Q. TODD DICKINSON

*Attesting Officer*     *Director of Patents and Trademarks*